(12) United States Patent
Machida

(10) Patent No.: US 7,772,109 B2
(45) Date of Patent: Aug. 10, 2010

(54) MANUFACTURING METHOD OF MULTILAYER WIRING SUBSTRATE

(75) Inventor: Yoshihiro Machida, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 666 days.

(21) Appl. No.: 11/724,265

(22) Filed: Mar. 15, 2007

(65) Prior Publication Data
US 2007/0218589 A1  Sep. 20, 2007

(30) Foreign Application Priority Data
Mar. 16, 2006  (JP) .................... P2006-073339

(51) Int. Cl.
*H01L 21/4763* (2006.01)
(52) U.S. Cl. .................. 438/622; 438/106; 438/455; 438/458; 438/460; 257/E23.062; 257/E23.065; 257/E23.173; 257/E23.177
(58) Field of Classification Search .......... 257/700, 257/702, E23.177, 23.062, E23.065, E23.173; 361/749; 174/254, 255; 438/106, 118, 125, 438/455, 458, 460
See application file for complete search history.

(56) References Cited

U.S. PATENT DOCUMENTS

| 6,545,353 | B2 * | 4/2003 | Mashino ............ 257/724 |
| 2005/0173048 | A1 * | 8/2005 | Alasaarela et al. ... 156/227 |
| 2006/0049130 | A1 * | 3/2006 | Watanabe ............ 216/13 |

FOREIGN PATENT DOCUMENTS

JP  9-283931  10/1997

\* cited by examiner

*Primary Examiner*—Matthew C Landau
*Assistant Examiner*—Lindsay Wickers
(74) *Attorney, Agent, or Firm*—Drinker Biddle & Reath LLP

(57) ABSTRACT

A first multilayer wiring structural body 16 and a second multilayer wiring structural body 56 are simultaneously formed on both surfaces 101A, 101B of a substrate 101 and thereafter the portion of a structural body 120 corresponding to a third region C1 is folded so as to oppose a second structural body 22 to a second structural body 62 and the first multilayer wiring structural body 16 is electrically connected to the second multilayer wiring structural body 56.

7 Claims, 34 Drawing Sheets

MANUFACTURING METHOD OF MULTILAYER WIRING SUBSTRATE

This application claims priority to Japanese Patent Application No. 2006-073339, filed Mar. 16, 2006, in the Japanese Patent Office. The priority application is incorporated by reference in its entirety.

TECHNICAL FIELD

The present disclosure relates to a manufacturing method of a multilayer wiring substrate having a multilayer wiring structural body.

RELATED ART

Multilayer wiring of a multilayer wiring substrate has been desired with high density growth in wiring in recent years. The multilayer wiring substrate is generally configured to dispose a multilayer wiring structural body having plural insulating layers and wiring patterns on both surfaces of the substrate. Also, when the multilayer wiring structural body is formed in the substrate, a build-up method of laminating a resin layer and a wiring pattern formed by a plating method is used.

However, when the multilayer wiring structural body is formed using the build-up method, poor electrical connection between the wiring patterns tends to occur as the number of laminations of the wiring patterns and the insulating layers increases, so that there was a problem of decreasing a yield of the multilayer wiring substrate.

A related-art art for solving such a problem includes a method of forming multilayer wiring structural bodies on both surfaces of two substrates and then stacking the two substrates on which the multilayer wiring structural bodies are formed and electrically connecting the two multilayer wiring structural bodies located in a vertical direction and manufacturing a multilayer wiring substrate.

By manufacturing the multilayer wiring substrate using such a manufacturing method, the number of laminations of the multilayer wiring structural bodies formed on both surfaces of two substrates (the number of laminations of wiring patterns and insulating layers) can be made smaller than ever before, so that a yield of the multilayer wiring substrate can be improved (for example, see Patent Reference 1: Japanese Patent Unexamined Publication No. 9-283931).

However, in the related-art manufacturing method of the multilayer wiring substrate, a yield of the multilayer wiring substrate can be improved, but there is a need to separately perform a step of forming a multilayer wiring structural body on both surfaces of one substrate and a step of forming a multilayer wiring structural body on both surfaces of the other substrate, so that there was a problem of increasing a manufacturing cost of the multilayer wiring substrate due to an increase in the manufacturing step.

SUMMARY

Embodiments of the present invention provide a manufacturing method of a multilayer wiring substrate capable of improving a yield and also reducing a manufacturing cost.

According to one standpoint of the invention, a manufacturing method of a wiring substrate characterized by including a substrate preparation step of preparing a substrate having a first region in which a first multilayer wiring structural body comprising plural insulating layers and wiring patterns is formed, and a second region disposed in a position spaced apart from the first region, the second region in which a second multilayer wiring structural body comprising plural insulating layers and wiring patterns is formed, a first and second multilayer wiring structural body formation step of simultaneously forming the first multilayer wiring structural body and the second multilayer wiring structural body on both surfaces of the substrate, and a connection step of folding the substrate so as to oppose the first multilayer wiring structural body to the second multilayer wiring structural body and electrically connecting the first multilayer wiring structural body to the second multilayer wiring structural body is provided.

According to the invention, by simultaneously forming a first multilayer wiring structural body and a second multilayer wiring structural body on both surfaces of a substrate and thereafter folding the substrate so as to oppose the first multilayer wiring structural body to the second multilayer wiring structural body and electrically connecting the first multilayer wiring structural body to the second multilayer wiring structural body, the number of laminations of the first and second multilayer wiring structural bodies (the number of laminations of wiring patterns and insulating layers) and the number of manufacturing steps in the case of forming the first and second multilayer wiring structural bodies can be reduced, so that a yield of a multilayer wiring substrate can be improved and also a manufacturing cost of the multilayer wiring substrate can be reduced.

According to the invention, a yield of a multilayer wiring substrate can be improved and also a manufacturing cost of the multilayer wiring substrate can be reduced.

Other features and advantages may be apparent from the following detailed description, the accompanying drawings and the claims.

DETAILED DESCRIPTION

Next, embodiments of the invention will be described based on the drawings.

First Embodiment

Figure 1:
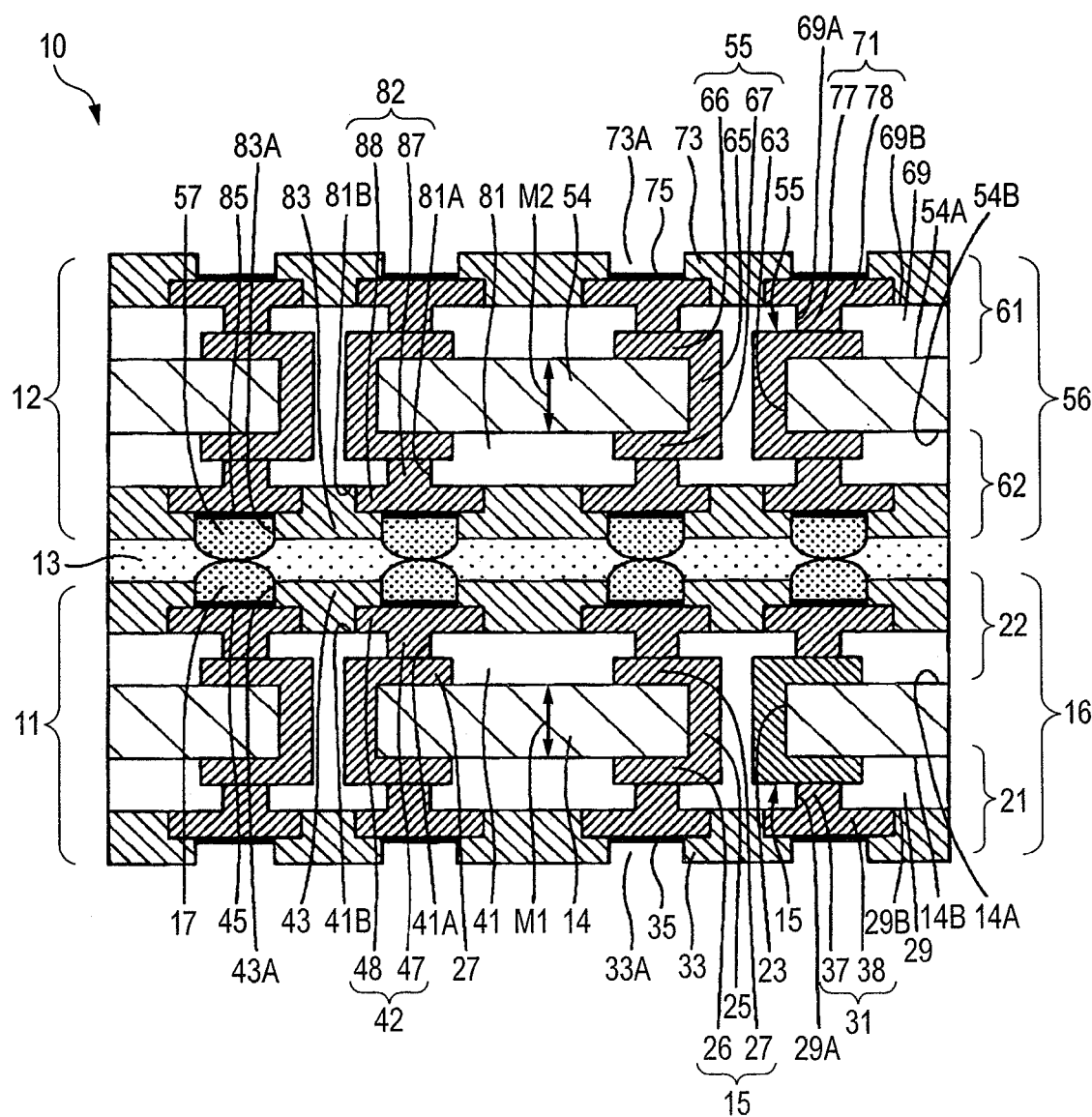
FIG. 1 is a sectional view of a multilayer wiring substrate according to a first exemplary embodiment of the invention.
Figure 2:
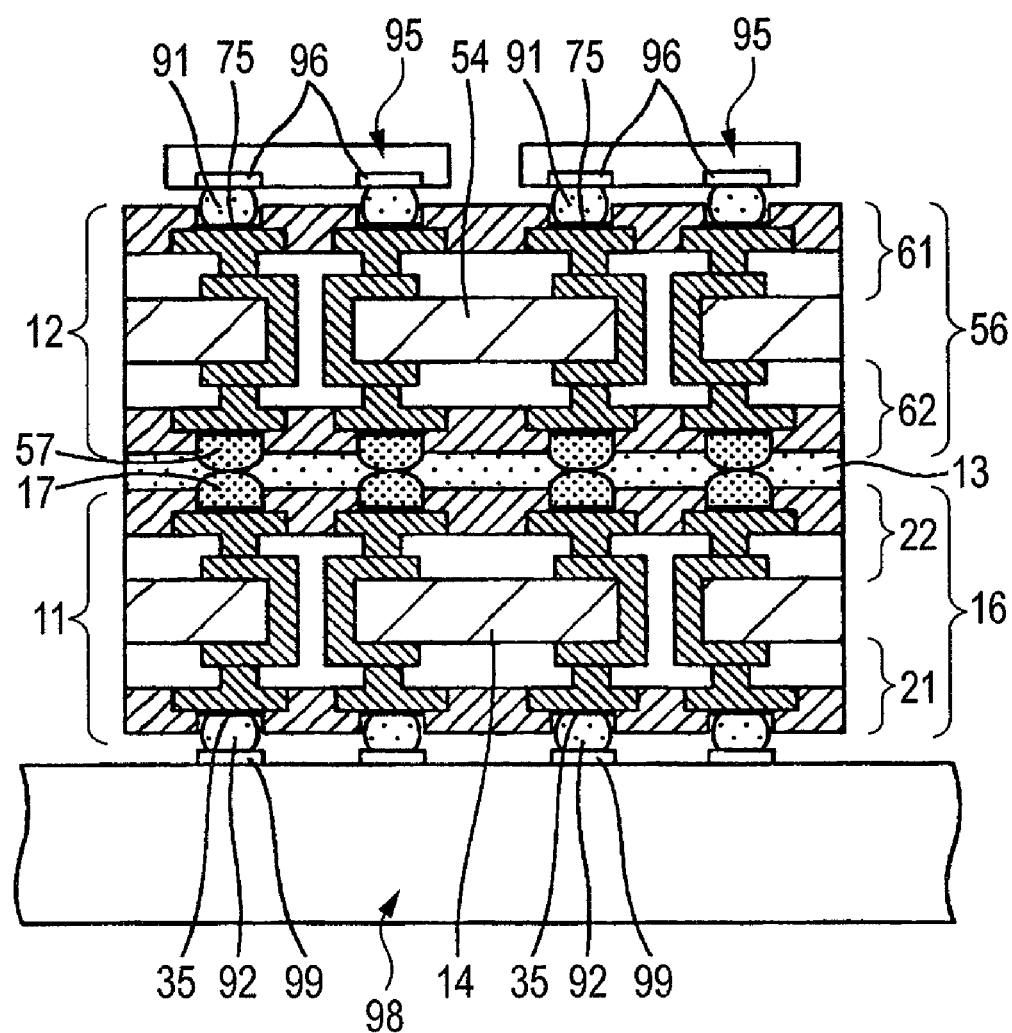
FIG. 2 is a sectional view of the multilayer wiring substrate connected to an electronic component and a mounting substrate.

FIG. 1 is a sectional view of a multilayer wiring substrate according to a first exemplary embodiment of the invention, and FIG. 2 is a sectional view of the multilayer wiring substrate connected to an electronic component and a mounting substrate. In FIG. 2, the same numerals are assigned to the same component portions as those of a multilayer wiring substrate 10 shown in FIG. 1.

Referring to FIGS. 1 and 2, the multilayer wiring substrate 10 of the first exemplary embodiment has a first wiring substrate 11 comprising a first multilayer wiring structural body 16, a second wiring substrate 12 comprising a second multilayer wiring structural body 56, and an underfill resin 13. The multilayer wiring substrate 10 is configured to laminate the second wiring substrate 12 on the first wiring substrate 11 and electrically connect the first multilayer wiring structural body 16 to the second multilayer wiring structural body 56.

The first wiring substrate 11 has a substrate 14, a through via 15, the first multilayer wiring structural body 16 comprising a first structural body 21 and a second structural body 22, and an internal connection terminal 17. The substrate 14 is formed in a plate shape, and has plural through holes 23. As the substrate 14, for example, a high rigid resin base material with a rigidity value of 20 GPa or more can be used. As a material of the high rigid resin base material, for example, a pre-preg resin in which non-woven fabrics or woven fabrics such as aramid or glass fiber are impregnated with a resin can be used. When the pre-preg resin is used as a material of the high rigid resin base material, a thickness M1 of the substrate 14 can be set at, for example, 0.2 mm.

The through via 15 has a via part 25 and wiring parts 26, 27. The via part 25 is disposed so as to cover a side wall of the through hole 23. The wiring part 26 is disposed on a lower surface 14B of the substrate 14 and is constructed integrally with the via part 25. The wiring part 27 is disposed on an upper surface 14A of the substrate 14 and is constructed integrally with the via part 25. The through via 15 makes electrical connection between the first structural body 21 disposed on the side of the lower surface 14B of the substrate 14 and the second structural body 22 disposed on the side of the upper surface 14A of the substrate 14. As a material of the through via 15, for example, a conductive metal can be used. Also, as the conductive metal used as the material of the through via 15, for example, Cu can be used.

The first multilayer wiring structural body 16 has the first structural body 21 disposed on the lower surface 14B of the substrate 14 and the second structural body 22 disposed on the upper surface 14A of the substrate 14. The first structural body 21 has an insulating layer 29, a wiring pattern 31, a solder resist 33 and a diffusion preventive film 35. The insulating layer 29 is disposed on the lower surface 14B of the substrate 14 so as to cover a part of the wiring part 26. The insulating layer 29 has an opening 29A for exposing the wiring part 26 corresponding to a formation position of a via 37. As the insulating layer 29, for example, a sheet-shaped resin material can be used. As a material of the sheet-shaped resin material, for example, an epoxy resin or a polyimide resin can be used.

The wiring pattern 31 has the via 37 and wiring 38. The via 37 is disposed in the opening 29A. The via 37 is in contact with the wiring part 26 and is electrically connected to the through via 15. The wiring 38 is disposed on a surface 29B of the insulating layer 29. The wiring 38 is constructed integrally with the via 37 and is electrically connected to the through via 15. As a material of the wiring pattern 31, a conductive metal can be used. Also, as the conductive metal used as the material of the wiring pattern 31, for example, Cu can be used.

The solder resist 33 is disposed on the surface 29B of the insulating layer 29 so as to cover a part of the wiring 38. The solder resist 33 has an opening 33A for exposing the wiring 38 corresponding to a formation position of the diffusion preventive film 35.

The diffusion preventive film 35 is disposed on the wiring 38 exposed to the opening 33A. The diffusion preventive film 35 is a film for preventing Cu included in the wiring pattern 31 from diffusing into an external connection terminal 92 (see FIG. 2). As the diffusion preventive film 35, for example, an Ni/Au laminated film in which an Ni layer and an Au layer are sequentially laminated from the side of the wiring 38 can be used.

The second structural body 22 has an insulating layer 41, a wiring pattern 42, a solder resist 43 and a diffusion preventive film 45.

The insulating layer 41 is disposed on the upper surface 14A of the substrate 14 so as to cover a part of the wiring part 27. The insulating layer 41 has an opening 41A for exposing the wiring part 27 corresponding to a formation position of a via 47. As the insulating layer 41, for example, a sheet-shaped resin material can be used. As a material of the sheet-shaped resin material, for example, an epoxy resin or a polyimide resin can be used.

The wiring pattern 42 has the via 47 and wiring 48. The via 47 is disposed in the opening 41A. The via 47 is in contact with the wiring part 27 and is electrically connected to the through via 15. The wiring 48 is disposed on a surface 41B of the insulating layer 41. The wiring 48 is constructed integrally with the via 47 and is electrically connected to the through via 15.

Therefore, the wiring pattern 42 disposed in the second structural body 22 is electrically connected to the wiring pattern 31 disposed in the first structural body 21 through the through via 15. As a material of the wiring pattern 42, a conductive metal can be used. Also, as the conductive metal used as the material of the wiring pattern 42, for example, Cu can be used.

The solder resist 43 is disposed on the surface 41B of the insulating layer 41 so as to cover a part of the wiring 48. The solder resist 43 has an opening 43A for exposing the wiring 48 corresponding to a formation position of the diffusion preventive film 45.

The diffusion preventive film 45 is disposed on the wiring 48 exposed to the opening 43A. The diffusion preventive film 45 is a film for preventing Cu included in the wiring pattern 42 from diffusing into an internal connection terminal 17. As the diffusion preventive film 45, for example, an Ni/Au laminated film in which an Ni layer and an Au layer are sequentially laminated from the side of the wiring 48 can be used.

The internal connection terminal 17 is disposed on the diffusion preventive film 45. The internal connection terminal 17 is connected to an internal connection terminal 57 disposed in the second wiring substrate 12. Consequently, the first multilayer wiring structural body 16 disposed in the first wiring substrate 11 is electrically connected to the second multilayer wiring structural body 56 disposed in the second wiring substrate 12. As the internal connection terminal 17, for example, a solder bump or an Au bump can be used.

The second wiring substrate 12 has a substrate 54, a through via 55, the second multilayer wiring structural body 56, and the internal connection terminal 57. The substrate 54 is formed in a plate shape, and has plural through holes 63. As the substrate 54, for example, a high rigid resin base material with a rigidity value of 20 GPa or more can be used. As a material of the high rigid resin base material, for example, a pre-preg resin in which non-woven fabrics or woven fabrics such as aramid or glass fiber are impregnated with a resin can be used. A thickness M2 of the substrate 54 could be constructed so as to become substantially equal to the thickness M1 of the substrate 14. When the pre-preg resin is used as a material of the high rigid resin base material, the thickness M2 of the substrate 54 can be set at, for example, 0.2 mm.

The through via 55 has a via part 65 and wiring parts 66, 67. The via part 65 is disposed so as to cover a side wall of the through hole 63. The wiring part 66 is disposed on an upper surface 54A of the substrate 54 and is constructed integrally with the via part 65. The wiring part 67 is disposed on a lower surface 54B of the substrate 54 and is constructed integrally with the via part 65. The through via 55 makes electrical connection between a first structural body 61 disposed on the side of the upper surface 54A of the substrate 54 and a second structural body 62 disposed on the side of the lower surface 54B of the substrate 54. As a material of the through via 55, for example, a conductive metal can be used. Also, as the conductive metal used as the material of the through via 55, for example, Cu can be used.

The second multilayer wiring structural body 56 has the first structural body 61 disposed on the upper surface 54A of the substrate 54 and the second structural body 62 disposed on the lower surface 54B of the substrate 54. The first structural body 61 has an insulating layer 69, a wiring pattern 71, a solder resist 73 and a diffusion preventive film 75.

The insulating layer 69 is disposed on the upper surface 54A of the substrate 54 so as to cover a part of the wiring part 66. The insulating layer 69 has an opening 69A for exposing the wiring part 66 corresponding to a formation position of a via 77. As the insulating layer 69, for example, a sheet-shaped resin material can be used. As a material of the sheet-shaped resin material, for example, an epoxy resin or a polyimide resin can be used.

The wiring pattern 71 has a via 77 and wiring 78. The via 77 is disposed in the opening 69A. The via 77 is in contact with the wiring part 66 and is electrically connected to the through via 55. The wiring 78 is disposed on a surface 69B of the insulating layer 69. The wiring 78 is constructed integrally with the via 77 and is electrically connected to the through via 55. As a material of the wiring pattern 71, a conductive metal can be used. Also, as the conductive metal used as the material of the wiring pattern 71, for example, Cu can be used.

The solder resist 73 is disposed on the surface 69B of the insulating layer 69 so as to cover a part of the wiring 78. The solder resist 73 has an opening 73A for exposing the wiring 78 corresponding to a formation position of the diffusion preventive film 75.

The diffusion preventive film 75 is disposed on the wiring 78 exposed to the opening 73A. The diffusion preventive film 75 is a film for preventing Cu included in the wiring pattern 71 from diffusing into an external connection terminal 91 (see FIG. 2). As the diffusion preventive film 75, for example, an Ni/Au laminated film in which an Ni layer and an Au layer are sequentially laminated from the side of the wiring 78 can be used.

The second structural body 62 has an insulating layer 81, a wiring pattern 82, a solder resist 83 and a diffusion preventive film 85.

The insulating layer 81 is disposed on the lower surface 54B of the substrate 54 so as to cover a part of the wiring part 67. The insulating layer 81 has an opening 81A for exposing the wiring part 67 corresponding to a formation position of a via 87. As the insulating layer 81, for example, a sheet-shaped resin material can be used. As a material of the sheet-shaped resin material, for example, an epoxy resin or a polyimide resin can be used.

The wiring pattern 82 has a via 87 and wiring 88. The via 87 is disposed in the opening 81A. The via 87 is in contact with the wiring part 67 and is electrically connected to the through via 55. The wiring 88 is disposed on a surface 81B of the insulating layer 81. The wiring 88 is constructed integrally with the via 87 and is electrically connected to the through via 55.

Therefore, the wiring pattern 82 disposed in the second structural body 62 is electrically connected to the wiring pattern 71 disposed in the first structural body 61 through the through via 55. As a material of the wiring pattern 82, a conductive metal can be used. Also, as the conductive metal used as the material of the wiring pattern 82, for example, Cu can be used.

The solder resist 83 is disposed on the surface 81B of the insulating layer 81 so as to cover a part of the wiring 88. The solder resist 83 has an opening 83A for exposing the wiring 88 corresponding to a formation position of the diffusion preventive film 85.

The diffusion preventive film 85 is disposed on the wiring 88 exposed to the opening 83A. The diffusion preventive film 85 is a film for preventing Cu included in the wiring pattern 82 from diffusing into an internal connection terminal 57. As the diffusion preventive film 85, for example, an Ni/Au laminated film in which an Ni layer and an Au layer are sequentially laminated from the side of the wiring 88 can be used.

The internal connection terminal 57 is disposed on the diffusion preventive film 85. The internal connection terminal 57 is connected to the internal connection terminal 17 disposed in the first wiring substrate 11.

Consequently, the second multilayer wiring structural body 56 disposed in the second wiring substrate 12 is electrically connected to the first multilayer wiring structural body 16 disposed in the first wiring substrate 11. As the internal connection terminal 57, for example, a solder bump or an Au bump can be used.

The underfill resin 13 is disposed so as to fill a gap between the first wiring substrate 11 and the second wiring substrate 12 connected by the internal connection terminals 17, 57. The underfill resin 13 is a resin for reinforcing connection between the internal connection terminal 17 and the internal connection terminal 57. As the underfill resin 13, for example, an epoxy resin or a polyimide resin can be used.

As shown in FIG. 2, the multilayer wiring substrate 10 constructed above, for example, is electrically connected to pads 96 of an electronic component 95 through the external connection terminal 91 disposed on the diffusion preventive film 75 and is electrically connected to pads 99 of a mounting substrate 98 through the external connection terminal 92 disposed on the diffusion preventive film 35. In this case, the multilayer wiring substrate 10 functions as an interposer for making electrical connection between the electronic component 95 and the mounting substrate 98. As the external connection terminal 91, for example, a solder bump or an Au bump can be used, and as the external connection terminal 92, for example, a solder ball can be used. Also, as the electronic component 95, for example, a semiconductor device can be used, and as the mounting substrate 98, for example, a motherboard can be used.

Figure 21:
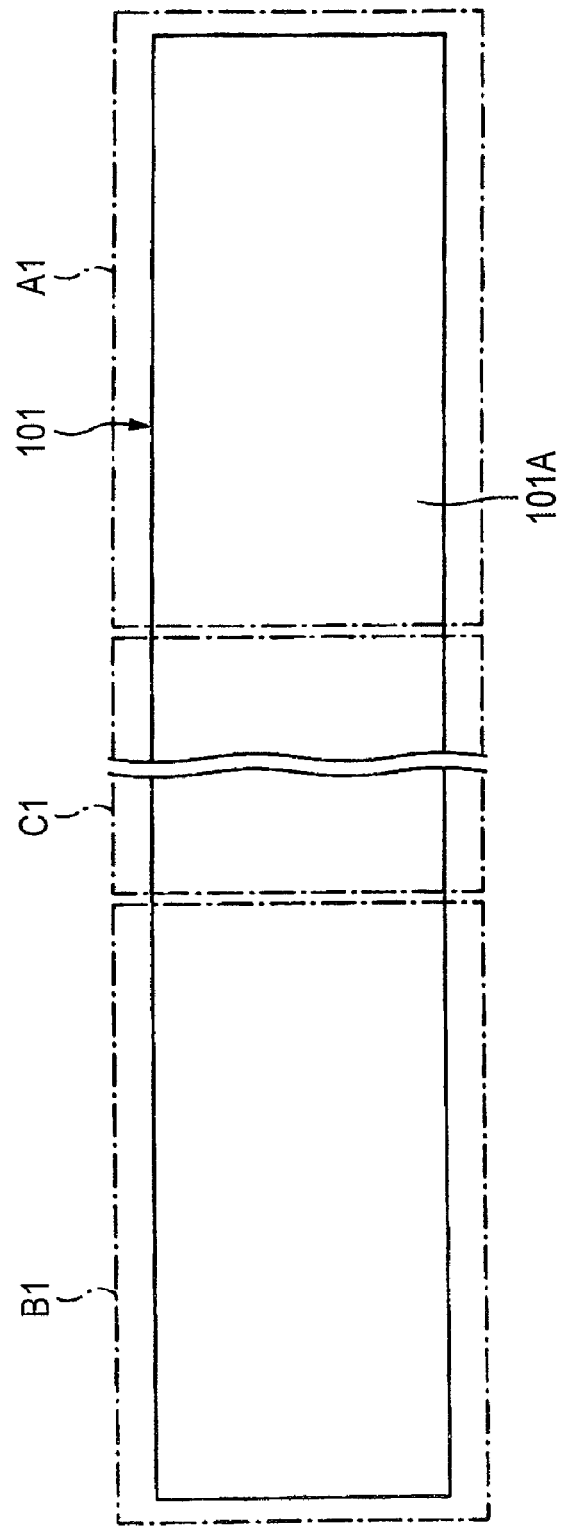
FIG. 21 is a diagram viewing the substrate shown in FIG. 3 from the plane.
Figure 22:
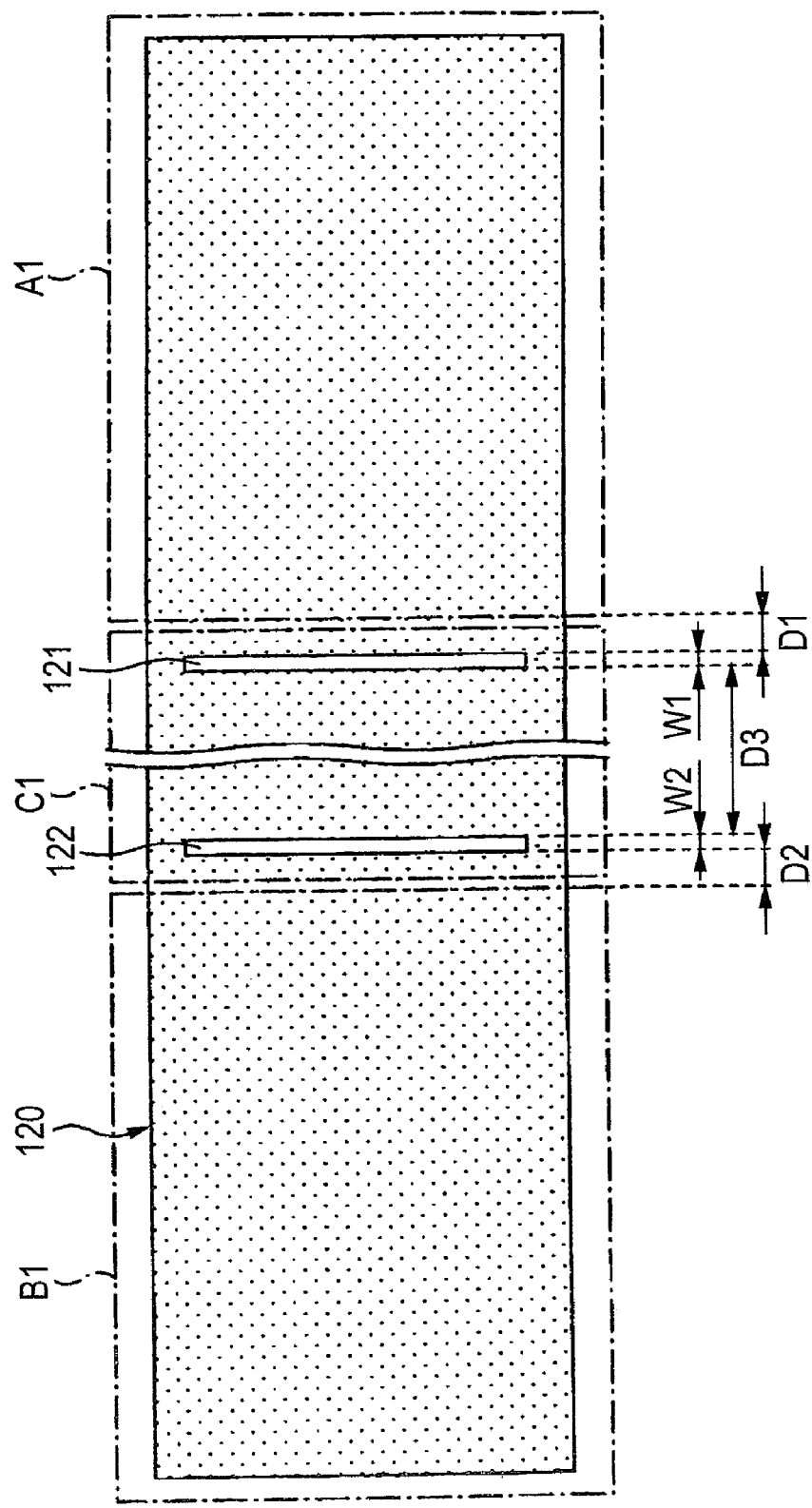
FIG. 22 is a diagram describing groove parts.

FIGS. 3 to 20 are diagrams showing manufacturing steps of the multilayer wiring substrate according to the first exemplary embodiment of the invention. Also, FIG. 21 is a diagram viewing the substrate shown in FIG. 3 from the plane, and FIG. 22 is a diagram describing groove parts. In FIGS. 3 to 20, the same numerals are assigned to the same component portions as those of the multilayer wiring substrate 10 of the first exemplary embodiment.

A manufacturing method of the multilayer wiring substrate according to the first exemplary embodiment of the invention will be described with reference to FIGS. 3 to 22.

Figure 3:
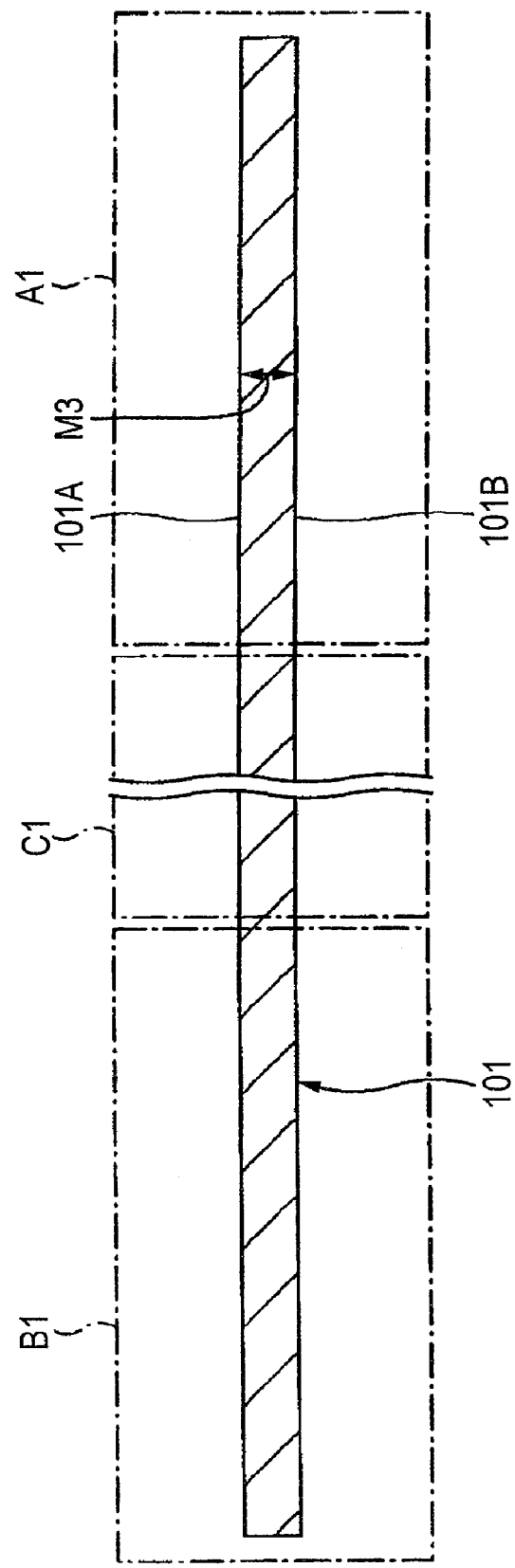
FIG. 3 is a diagram showing a manufacturing step of the multilayer wiring substrate according to the first exemplary embodiment of the invention (first).

First, in a step shown in FIG. 3, a substrate 101 having a first region A1 in which a first wiring substrate 11 comprising a first multilayer wiring structural body 16 is formed, a second region B1 in which a second wiring substrate 12 comprising a second multilayer wiring structural body 56 is formed, the second region B1 being disposed in a position spaced apart from the first region A1, and a third region C1 disposed between the first region A1 and the second region B1 is prepared (a substrate preparation step).

The substrate 101 corresponding to the first region A1 is the portion corresponding to a substrate 14 of the first wiring substrate 11, and the substrate 101 corresponding to the second region B1 is the portion corresponding to a substrate 54 of the second wiring substrate 12. An upper surface 101A of the substrate 101 corresponding to the first region A1 is a surface equivalent to a lower surface 14B of the substrate 14, and a lower surface 101B of the substrate 101 corresponding to the first region A1 is a surface equivalent to an upper surface 14A of the substrate 14. Also, the upper surface 101A of the substrate 101 corresponding to the second region B1 is a surface equivalent to an upper surface 54A of the substrate 54, and the lower surface 101B of the substrate 101 corresponding to the second region B1 is a surface equivalent to a lower surface 54B of the substrate 54.

The first multilayer wiring structural body 16 is formed on both surfaces 101A, 101B of the substrate 101 corresponding to the first region A1 as described below, and the second multilayer wiring structural body 56 is formed on both surfaces 101A, 101B of the substrate 101 corresponding to the second region B1 as described below.

By manufacturing the multilayer wiring substrate 10 using the substrate 101 having the first region A1 in which the first wiring substrate 11 comprising the first multilayer wiring structural body 16 is formed and the second region B1 in which the second wiring substrate 12 comprising the second multilayer wiring structural body 56 is formed thus, the number of laminations of the first and second multilayer wiring structural bodies 16, 56 formed on both surfaces 101A, 101B of the substrate 101 (the number of laminations of wiring patterns and insulating layers) can be reduced to suppress occurrence of poor electrical connection between wiring patterns 31, 42, 71, 82, so that a yield of the multilayer wiring substrate 10 can be improved.

As the substrate 101, for example, a high rigid resin base material with a rigidity value of 20 GPa or more can be used. As a material of the high rigid resin base material, for example, a pre-preg resin in which non-woven fabrics or woven fabrics such as aramid or glass fiber are impregnated with a resin can be used. When the pre-preg resin is used as a material of the high rigid resin base material, a thickness M3 of the substrate 101 can be set at, for example, 0.2 mm.

Figure 4:
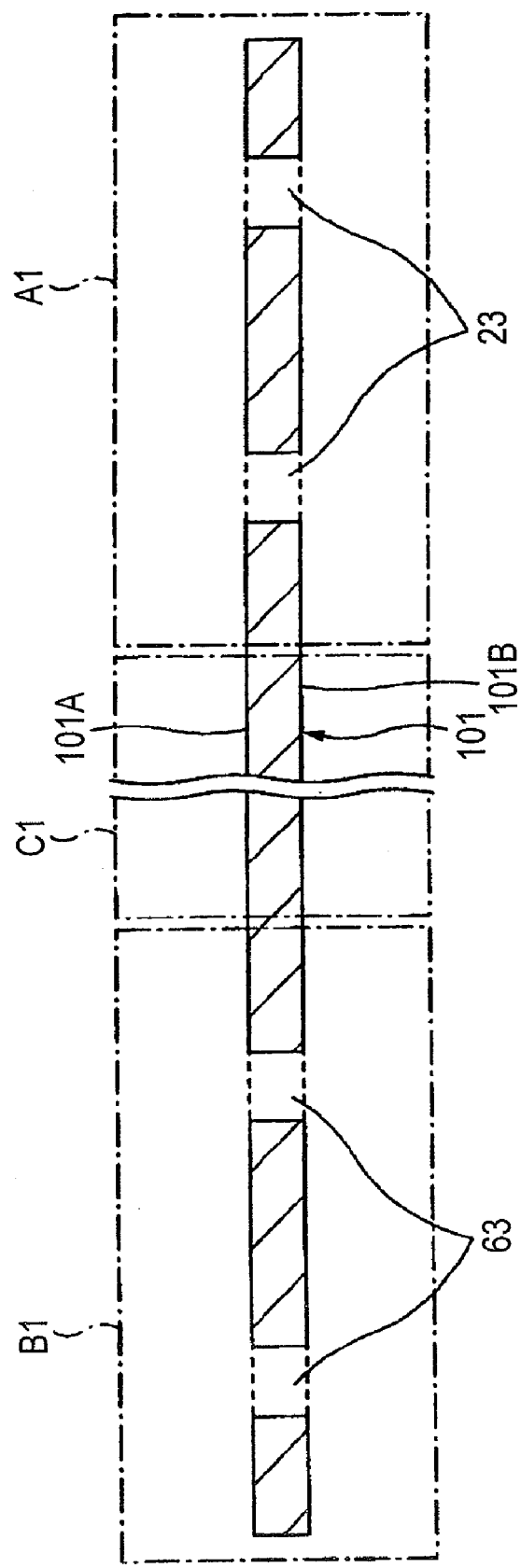
FIG. 4 is a diagram showing a manufacturing step of the multilayer wiring substrate according to the first exemplary embodiment of the invention (second).

Next, in a step shown in FIG. 4, through holes 23 are formed in the substrate 101 corresponding to the first region A1 and through holes 63 are formed in the substrate 101 corresponding to the second region B1.

Figure 5:
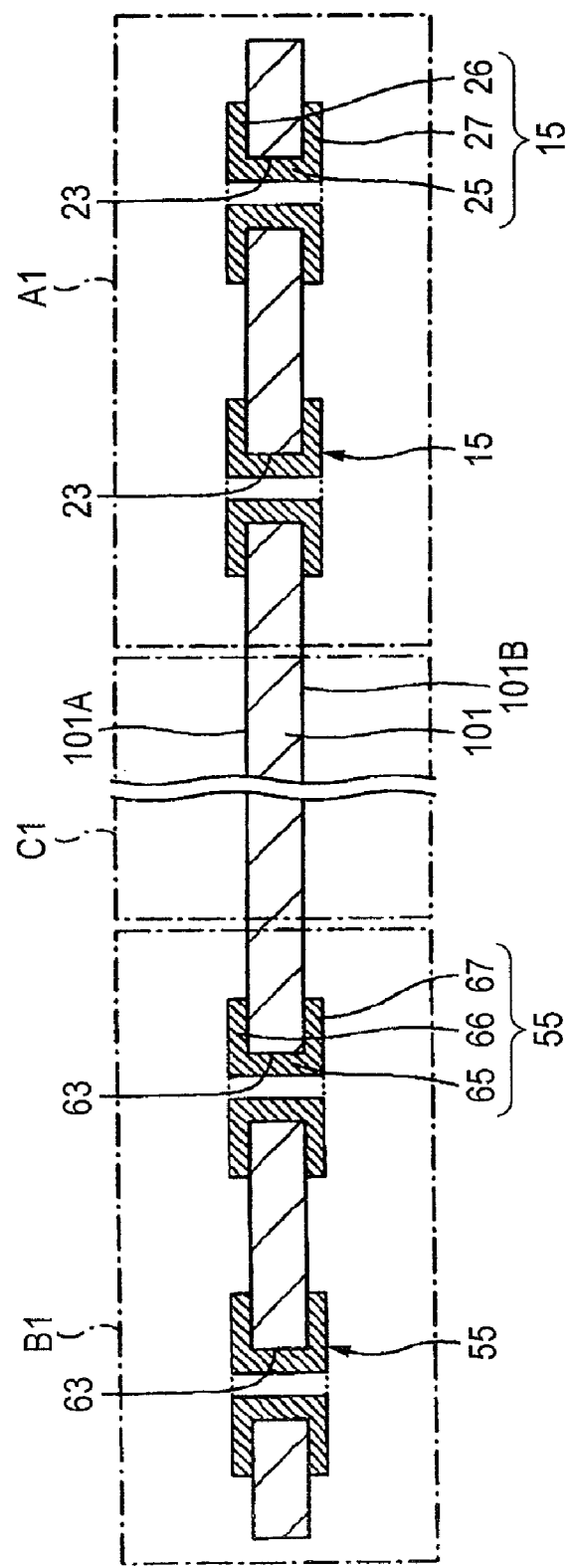
FIG. 5 is a diagram showing a manufacturing step of the multilayer wiring substrate according to the first exemplary embodiment of the invention (third).

Then, in a step shown in FIG. 5, a through via 15 extending from a side wall of the through hole 23 to both surfaces 101A, 101B of the substrate 101 and a through via 55 extending from a side wall of the through hole 63 to both surfaces 101A, 101B of the substrate 101 are simultaneously formed.

Concretely, for example, a seed layer is formed on a surface (including the side wall of the through holes 23, 63) of the substrate 101 in which the through holes 23, 63 are formed by an electroless plating method and subsequently, a plated film is formed by an electrolytic plating method using the seed layer as a power feeding layer. Thereafter, the through via 15 having a via part 25 and wiring parts 26, 27 and the through via 55 having a via part 65 and wiring parts 66, 67 are simultaneously formed by patterning the seed layer and the plated film disposed on both surfaces 101A, 101B of the substrate 101 by etching.

Figure 6:
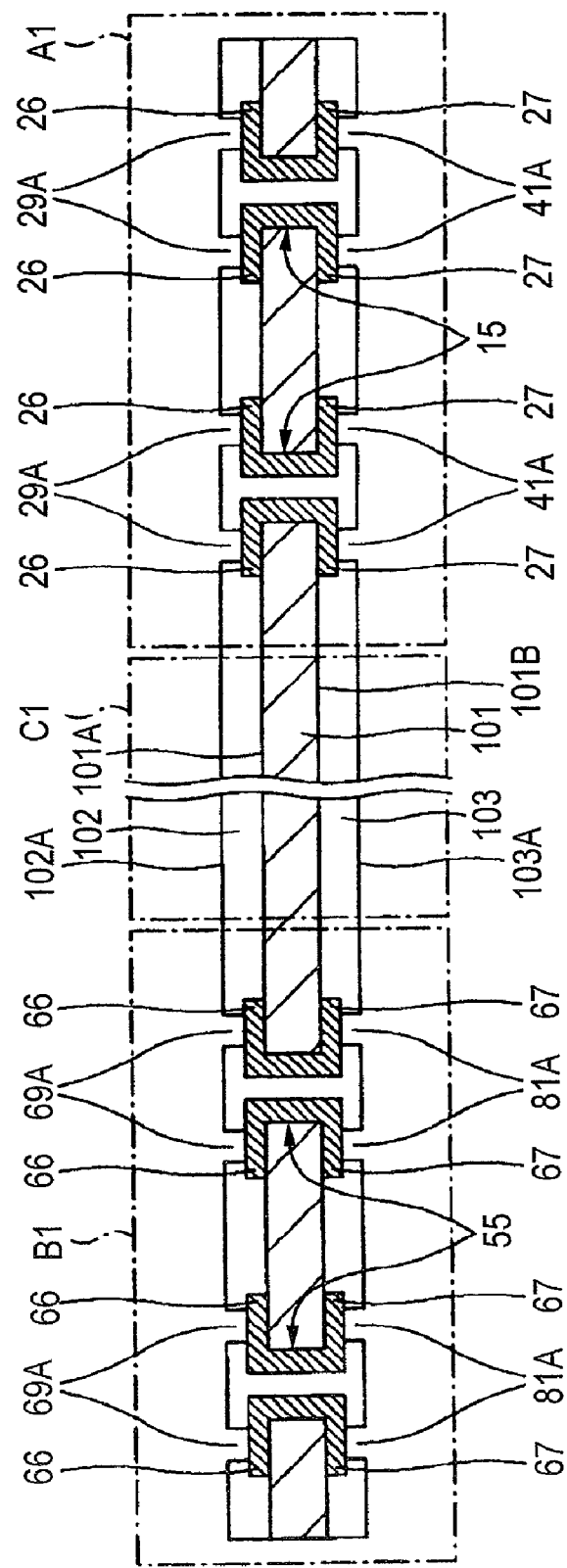
FIG. 6 is a diagram showing a manufacturing step of the multilayer wiring substrate according to the first exemplary embodiment of the invention (fourth).

Then, in a step shown in FIG. 6, an insulating layer 102 having openings 29A, 69A is formed on the upper surface side of a structural body shown in FIG. 5, and an insulating layer 103 having openings 41A, 81A is formed on the lower surface side of the structural body shown in FIG. 5. The insulating layer 102 corresponding to the first region A1 is the portion equivalent to an insulating layer 29 (see FIG. 1), and the insulating layer 102 corresponding to the second region B1 is the portion equivalent to an insulating layer 69 (see FIG. 1). Also, the insulating layer 103 corresponding to the first region A1 is the portion equivalent to an insulating layer 41 (see FIG. 1), and the insulating layer 103 corresponding to the second region B1 is the portion equivalent to an insulating layer 81 (see FIG. 1).

As a material of the insulating layers 102, 103, for example, an epoxy resin or a polyimide resin can be used. Also, as the insulating layers 102, 103, a sheet-shaped resin material can be used. The openings 29A, 41A, 69A, 81A can be formed by, for example, laser machining.

Figure 7:
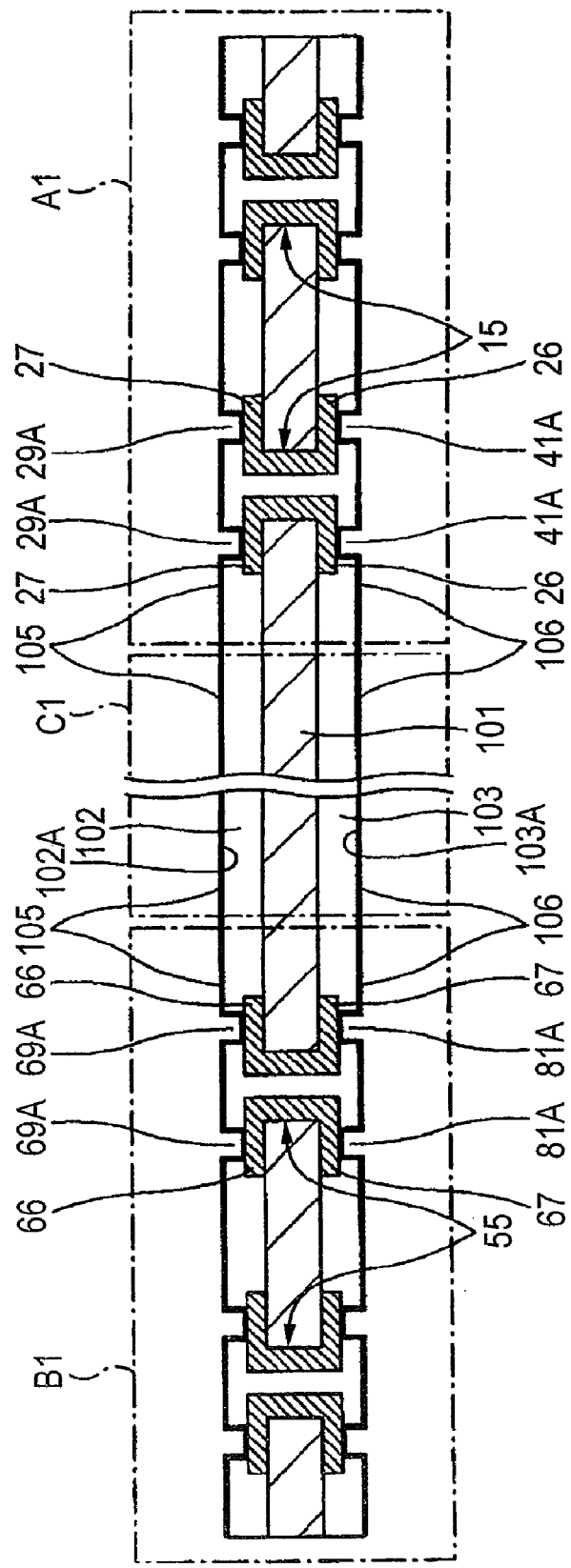
FIG. 7 is a diagram showing a manufacturing step of the multilayer wiring substrate according to the first exemplary embodiment of the invention (fifth).

Then, in a step shown in FIG. 7, a seed layer 105 with which the openings 29A, 69A and a surface 102A of the insulating layer 102 are covered and a seed layer 106 with which the openings 41A, 81A and a surface 103A of the insulating layer 103 are covered are simultaneously formed.

Concretely, for example, after surfaces (including side walls of the openings 29A, 41A, 69A, 81A) of the insulating layers 102, 103 are roughened by desmear treatment, a metal film is precipitated on the surfaces of the insulating layers 102, 103 by an electroless plating method and thereby the seed layers 105, 106 are formed. As a material of the seed layers 105, 106, a conductive metal can be used. As the conductive metal used as the material of the seed layers 105, 106, for example, Cu can be used.

Figure 8:
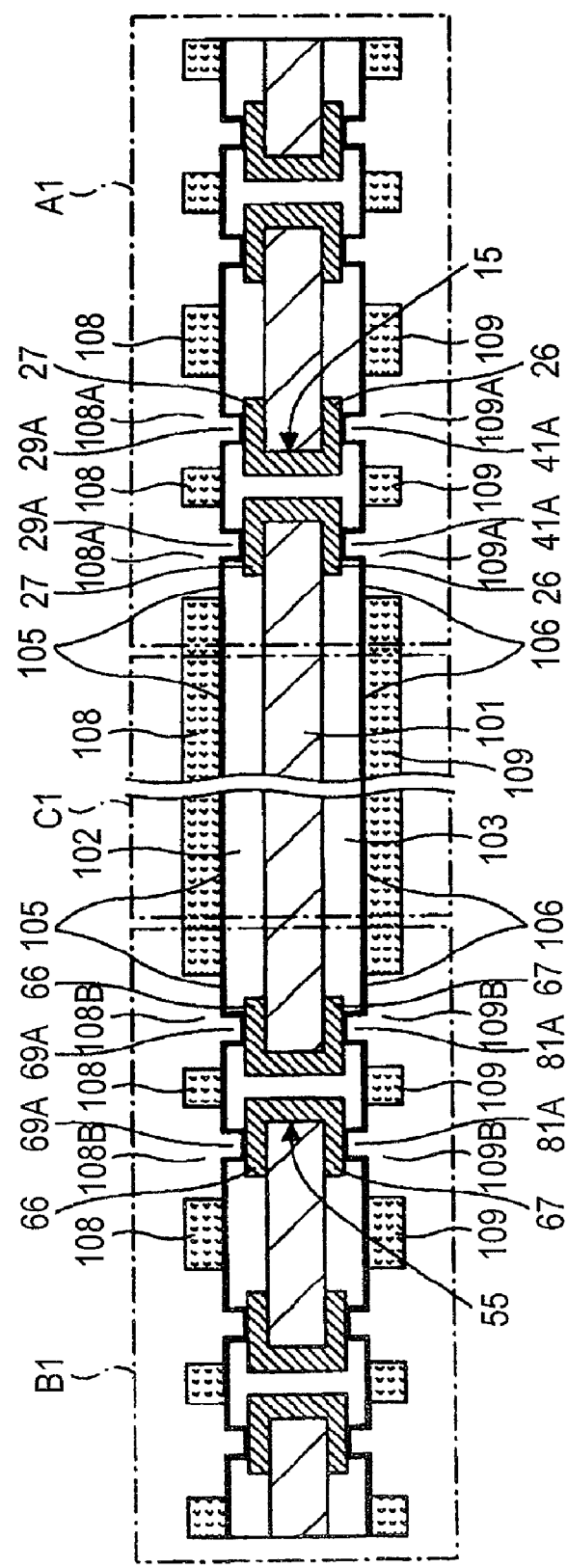
FIG. 8 is a diagram showing a manufacturing step of the multilayer wiring substrate according to the first exemplary embodiment of the invention (sixth).

Then, in a step shown in FIG. 8, a resist film 108 having openings 108A, 108B is formed on the seed layer 105 and a resist film 109 having openings 109A, 109B is formed on the seed layer 106.

The seed layer 105 corresponding to a formation position of a wiring pattern 31 is exposed to the opening 108A, and the seed layer 105 corresponding to a formation position of a wiring pattern 71 is exposed to the opening 108B. Also, the seed layer 106 corresponding to a formation position of a wiring pattern 42 is exposed to the opening 109A, and the seed layer 106 corresponding to a formation position of a wiring pattern 82 is exposed to the opening 109B.

Figure 9:
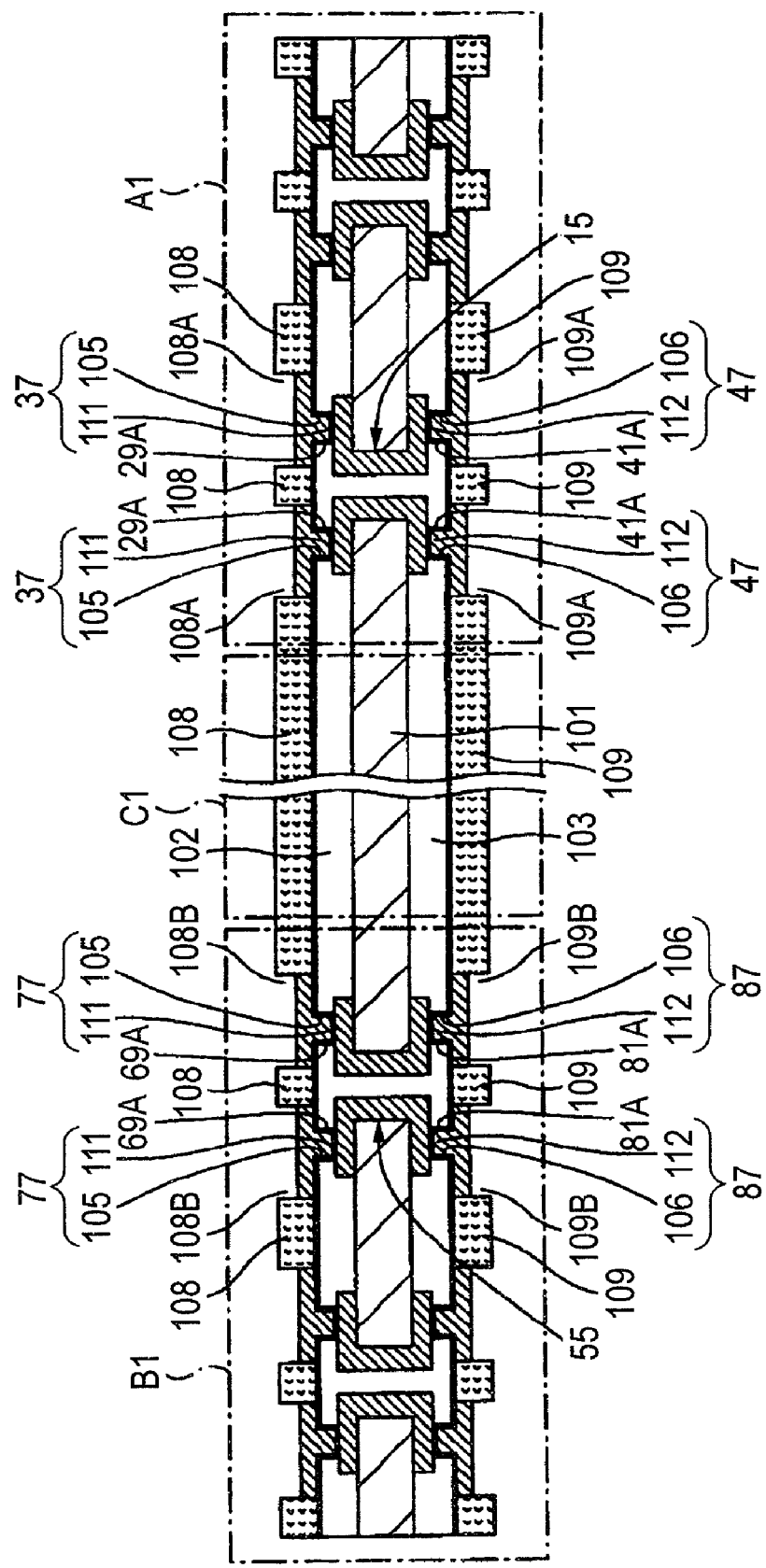
FIG. 9 is a diagram showing a manufacturing step of the multilayer wiring substrate according to the first exemplary embodiment of the invention (seventh).

Then, in a step shown in FIG. 9, a conductive metal 111 is formed on the seed layer 105 exposed to the openings 108A, 108B and a conductive metal 112 is formed on the seed layer 106 exposed to the openings 109A, 109B simultaneously by an electrolytic plating method using the seed layers 105, 106 as a power feeding layer.

Consequently, a via 37 made of the seed layer 105 and the conductive metal 111 is formed in the opening 29A, and a via 47 made of the seed layer 106 and the conductive metal 112 is formed in the opening 41A. Also, a via 77 made of the seed layer 105 and the conductive metal 111 is formed in the opening 69A, and a via 87 made of the seed layer 106 and the conductive metal 112 is formed in the opening 81A.

Figure 10:
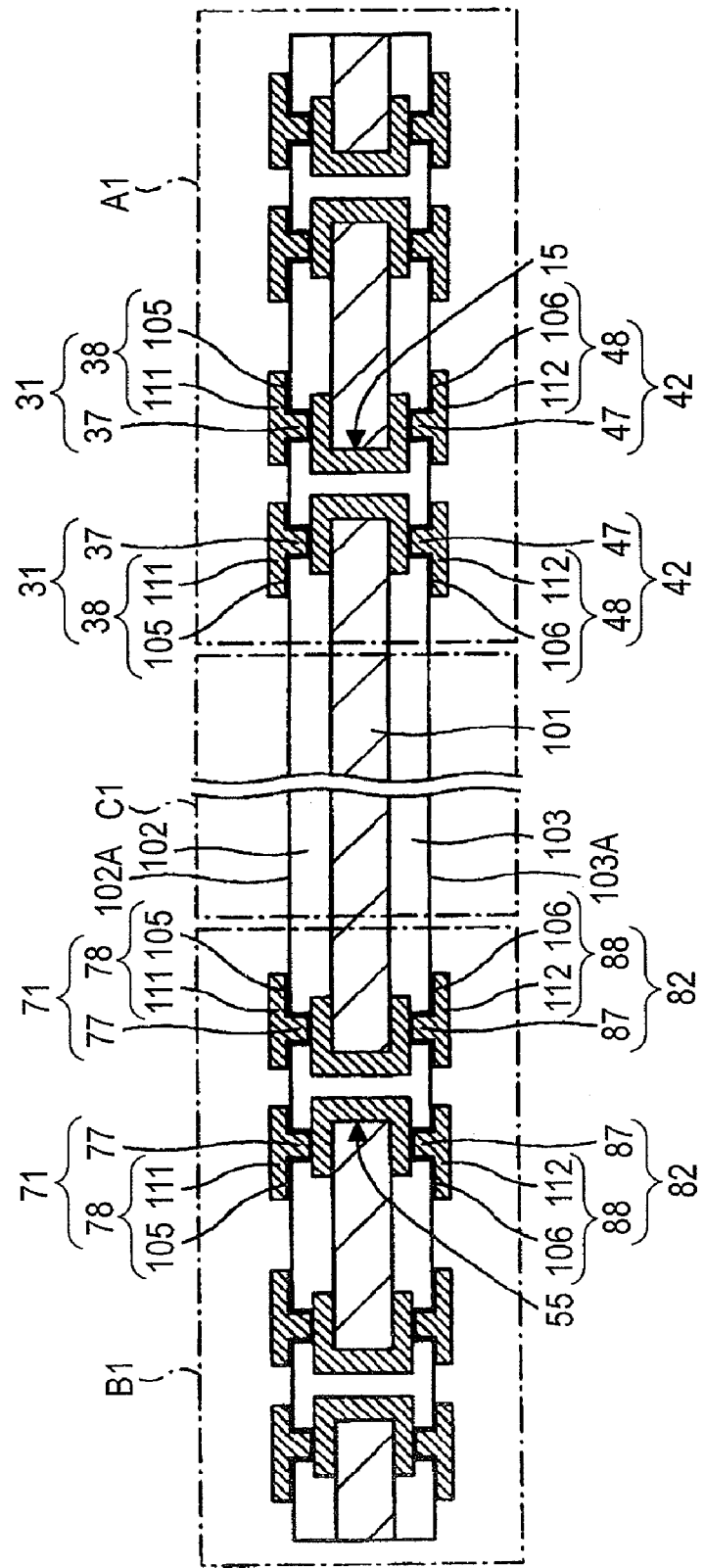
FIG. 10 is a diagram showing a manufacturing step of the multilayer wiring substrate according to the first exemplary embodiment of the invention (eighth).

Then, in a step shown in FIG. 10, the resist films 108, 109 are removed and thereafter, the unnecessary seed layers 105, 106 which are not covered with the conductive metals 111, 112 are removed. Consequently, wirings 38, 78 made of the seed layer 105 and the conductive metal 111 are formed on the surface 102A of the insulating layer 102, and wirings 48, 88 made of the seed layer 106 and the conductive metal 112 are formed on the surface 103A of the insulating layer 103. The unnecessary seed layers 105, 106 which are not covered with the conductive metals 111, 112 are removed by, for example, wet etching.

Then, in a step shown in FIG. 11, a solder resist 114 having openings 33A, 73A is formed so as to cover the upper surface side of a structural body shown in FIG. 10 and subsequently, a solder resist 115 having openings 43A, 83A is formed so as to cover the lower surface side of the structural body shown in FIG. 10. The opening 33A is formed so as to expose the wiring 38, and the opening 43A is formed so as to expose the wiring 48. Also, the opening 73A is formed so as to expose the wiring 78, and the opening 83A is formed so as to expose the wiring 88.

Concretely, for example, the solder resists 114, 115 are formed by sticking sheet-shaped solder resists. Also, the openings 33A, 73A, 43A, 83A are formed by exposing and developing the solder resists 114, 115.

The solder resist 114 corresponding to the first region A1 is the portion equivalent to a solder resist 33 (see FIG. 1), and the solder resist 114 corresponding to the second region B1 is the portion equivalent to a solder resist 73 (see FIG. 1). Also, the solder resist 115 corresponding to the first region A1 is the portion equivalent to a solder resist 43 (see FIG. 1), and the solder resist 115 corresponding to the second region B1 is the portion equivalent to a solder resist 83 (see FIG. 1).

Figure 12:
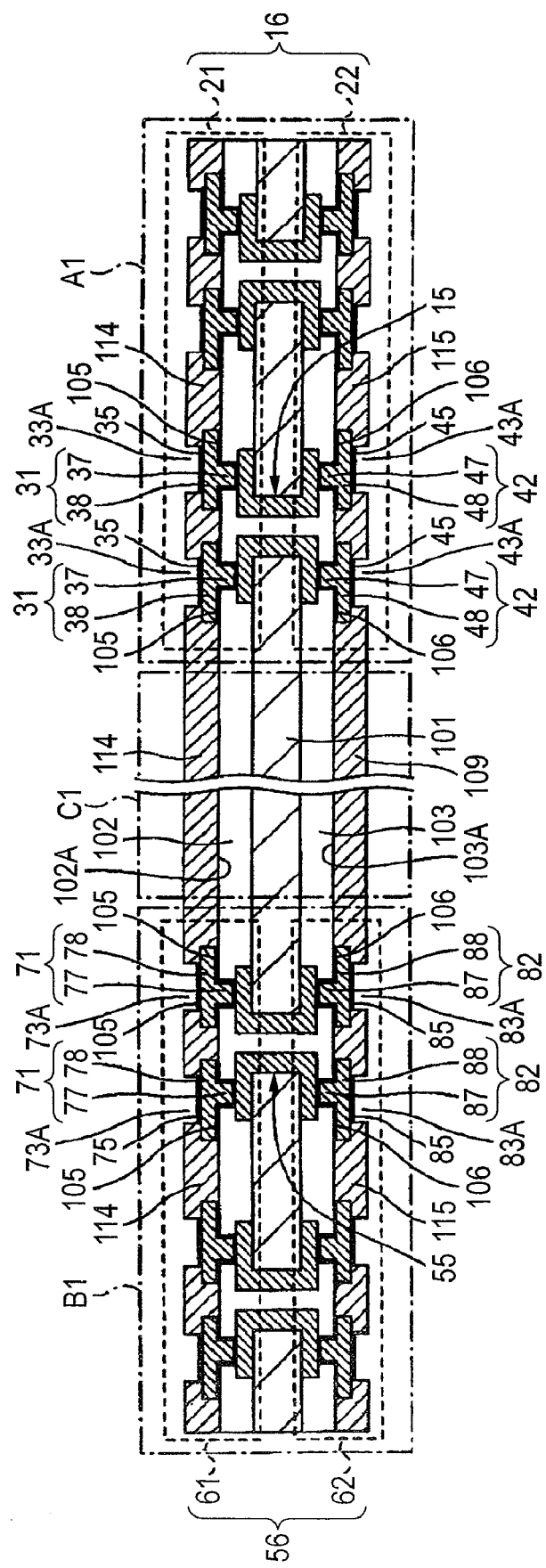
FIG. 12 is a diagram showing a manufacturing step of the multilayer wiring substrate according to the first exemplary embodiment of the invention (tenth).

Then, in a step shown in FIG. 12, a diffusion preventive film 35 is formed on the wiring 38 exposed to the opening 33A and a diffusion preventive film 45 is formed on the wiring 48 exposed to the opening 43A and a diffusion preventive film 75 is formed on the wiring 78 exposed to the opening 73A and a diffusion preventive film 85 is formed on the wiring 88 exposed to the opening 83A simultaneously by an electrolytic plating method.

Concretely, for example, the diffusion preventive films 35, 45, 75, 85 are simultaneously formed by forming an Ni/Au laminated film in which an Ni layer and an Au layer are sequentially laminated on the wirings 38, 48, 78, 88 by the electrolytic plating method.

Consequently, the first multilayer wiring structural body 16 and the second multilayer wiring structural body 56 are simultaneously formed. In addition, in the case of the embodiment, the step shown in FIGS. 4 to 12 corresponds to a first and second multilayer wiring structural body formation step.

By simultaneously forming the first multilayer wiring structural body 16 and the second multilayer wiring structural body 56 on both surfaces 101A, 101B of one substrate 101 thus, the number of manufacturing steps of the first and second multilayer wiring structural bodies 16, 56 becomes smaller than the related-art manufacturing method of the multilayer wiring substrate in which multilayer wiring structural bodies are respectively formed on both surfaces of two substrates, so that a yield of the multilayer wiring substrate 10 can be improved and also a manufacturing cost of the multilayer wiring substrate 10 can be reduced.

Figure 13:
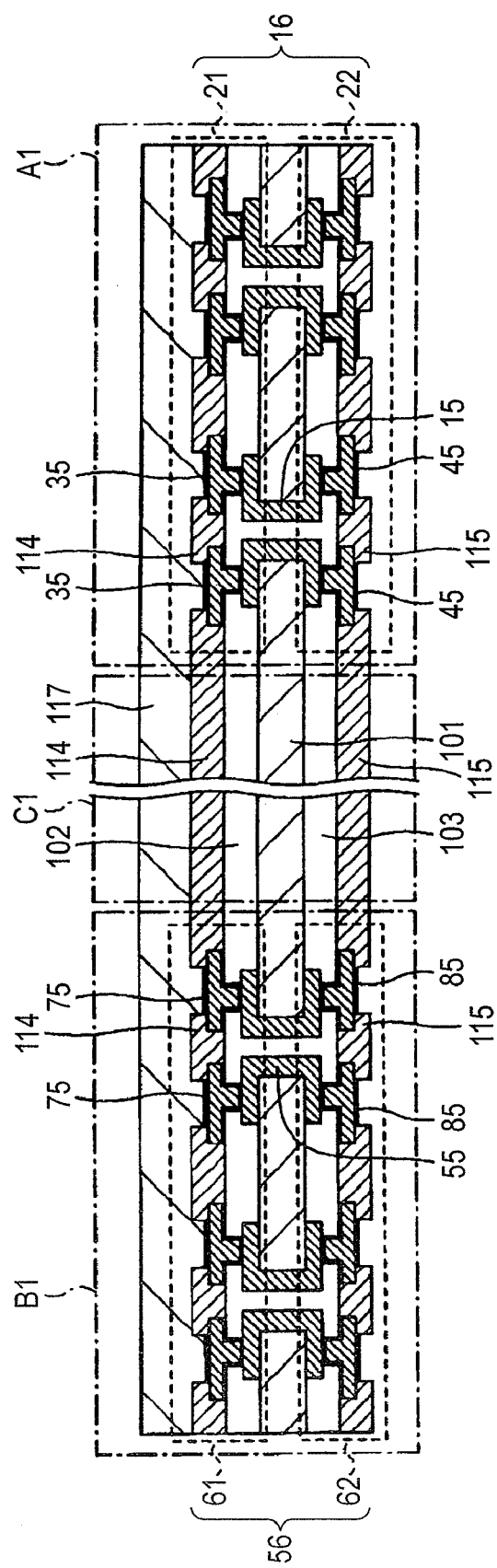
FIG. 13 is a diagram showing a manufacturing step of the multilayer wiring substrate according to the first exemplary embodiment of the invention (eleventh).
Figure 14:
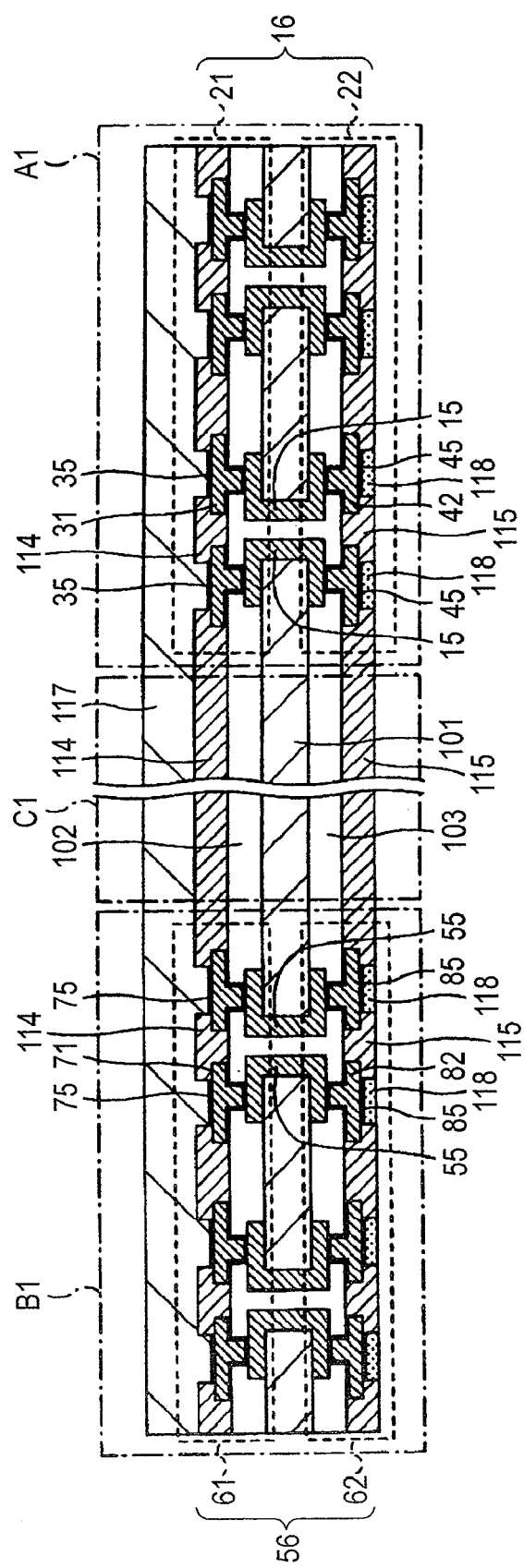
FIG. 14 is a diagram showing a manufacturing step of the multilayer wiring substrate according to the first exemplary embodiment of the invention (twelfth).

Then, in a step shown in FIG. 13, a masking material 117 is stuck so as to cover the upper surface side of a structural body shown in FIG. 12. Then, in a step shown in FIG. 14, solder 118 is formed on the diffusion preventive films 45, 85 by a plating method. Then, in a step shown in FIG. 15, the masking material 117 is peeled and removed.

Figure 15:
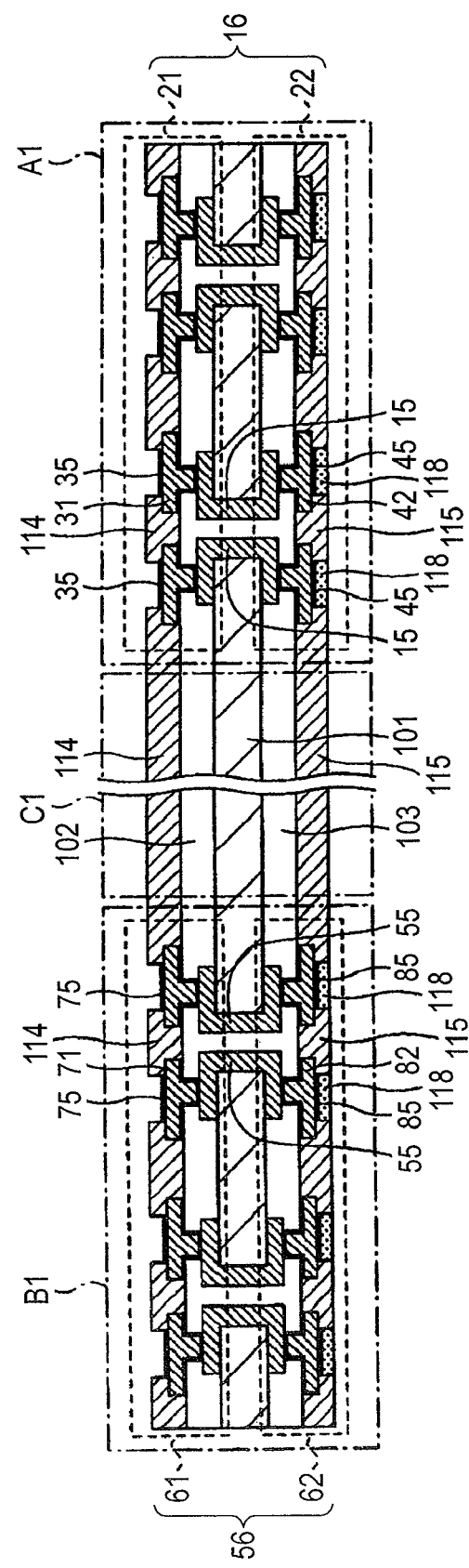
FIG. 15 is a diagram showing a manufacturing step of the multilayer wiring substrate according to the first exemplary embodiment of the invention (thirteenth).
Figure 16:
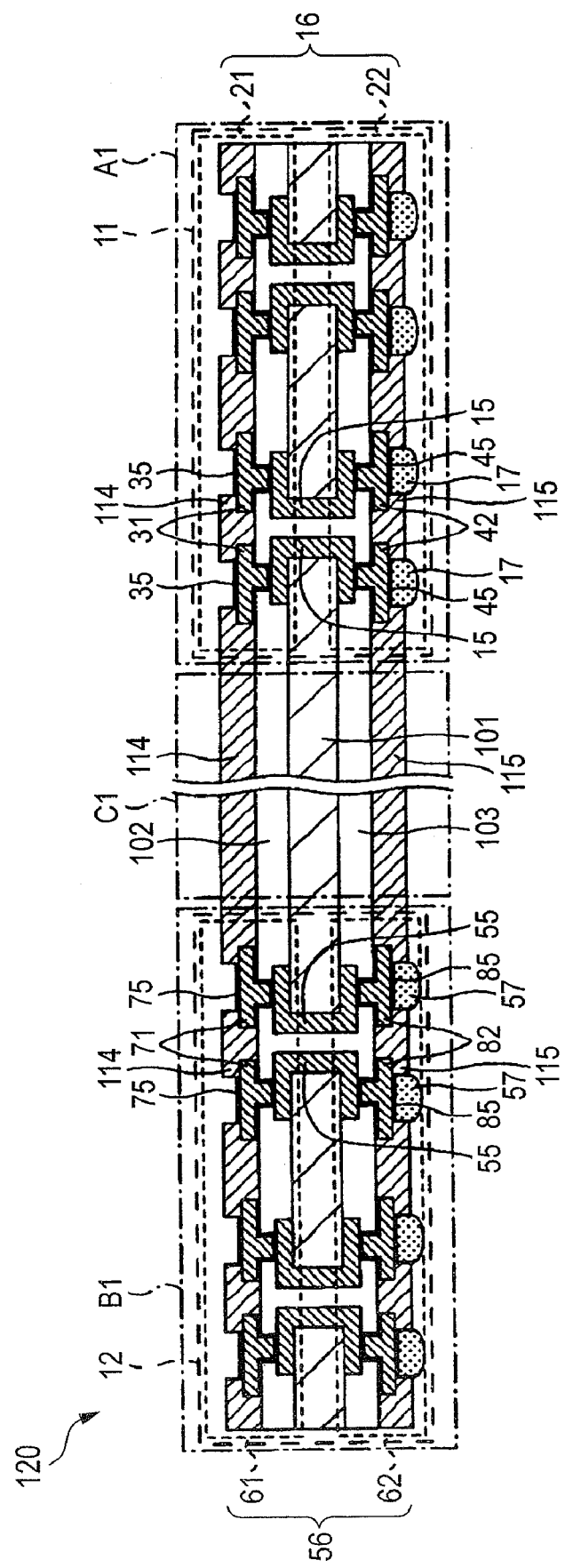
FIG. 16 is a diagram showing a manufacturing step of the multilayer wiring substrate according to the first exemplary embodiment of the invention (fourteenth).

Then, in a step shown in FIG. 16, a structural body shown in FIG. 15 is heated and internal connection terminals 17, 57 are formed. Consequently, the first wiring substrate 11 is formed in the portion corresponding to the first region A1 of a structural body 120 shown in FIG. 16, and the second wiring substrate 12 is formed in the portion corresponding to the second region B1 of the structural body 120 shown in FIG. 16. In addition, in the step shown in FIG. 16, solder bumps are formed as the internal connection terminals 17, 57.

Figure 17:
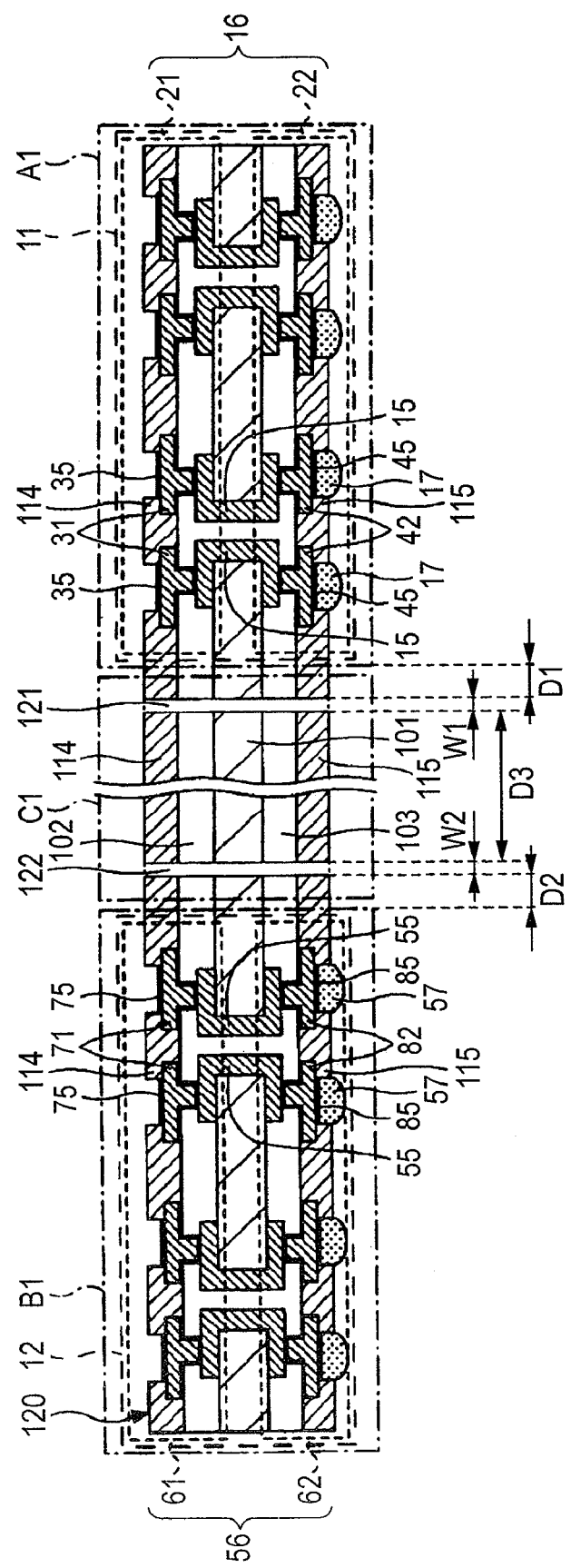
FIG. 17 is a diagram showing a manufacturing step of the multilayer wiring substrate according to the first exemplary embodiment of the invention (fifteenth).

Then, in a step shown in FIG. 17, first and second groove parts 121, 122 are formed in the structural body 120 corresponding to the third region C1 (a groove part formation step).

The first groove part 121 is disposed in the vicinity of the first region A1 as opposed to the first region A1. The first groove part 121 is a through groove extending through the structural body 120 corresponding to the third region C1 (see FIG. 22). The first groove part 121 is arranged in a position spaced apart from the first region A1 by a distance D1. The distance D1 can be set at, for example, 5 mm. Also, a width W1 of the first groove part 121 can be set at, for example, 1 mm.

The second groove part 122 is disposed in the vicinity of the second region B1 as opposed to the second region B1. The second groove part 122 is a through groove extending through the structural body 120 corresponding to the third region C1 (see FIG. 22). The second groove part 122 is arranged in a position spaced apart from the second region B1 by a distance D2. The distance D2 can be set at, for example, 5 mm. Also, a width W2 of the second groove part 122 can be set at, for example, 1 mm.

The first and second groove parts 121, 122 can be formed by, for example, a dicer or a router. Also, a distance D3 between the first groove part 121 and the second groove part 122 can be set at, for example, 10 mm.

Figure 18:
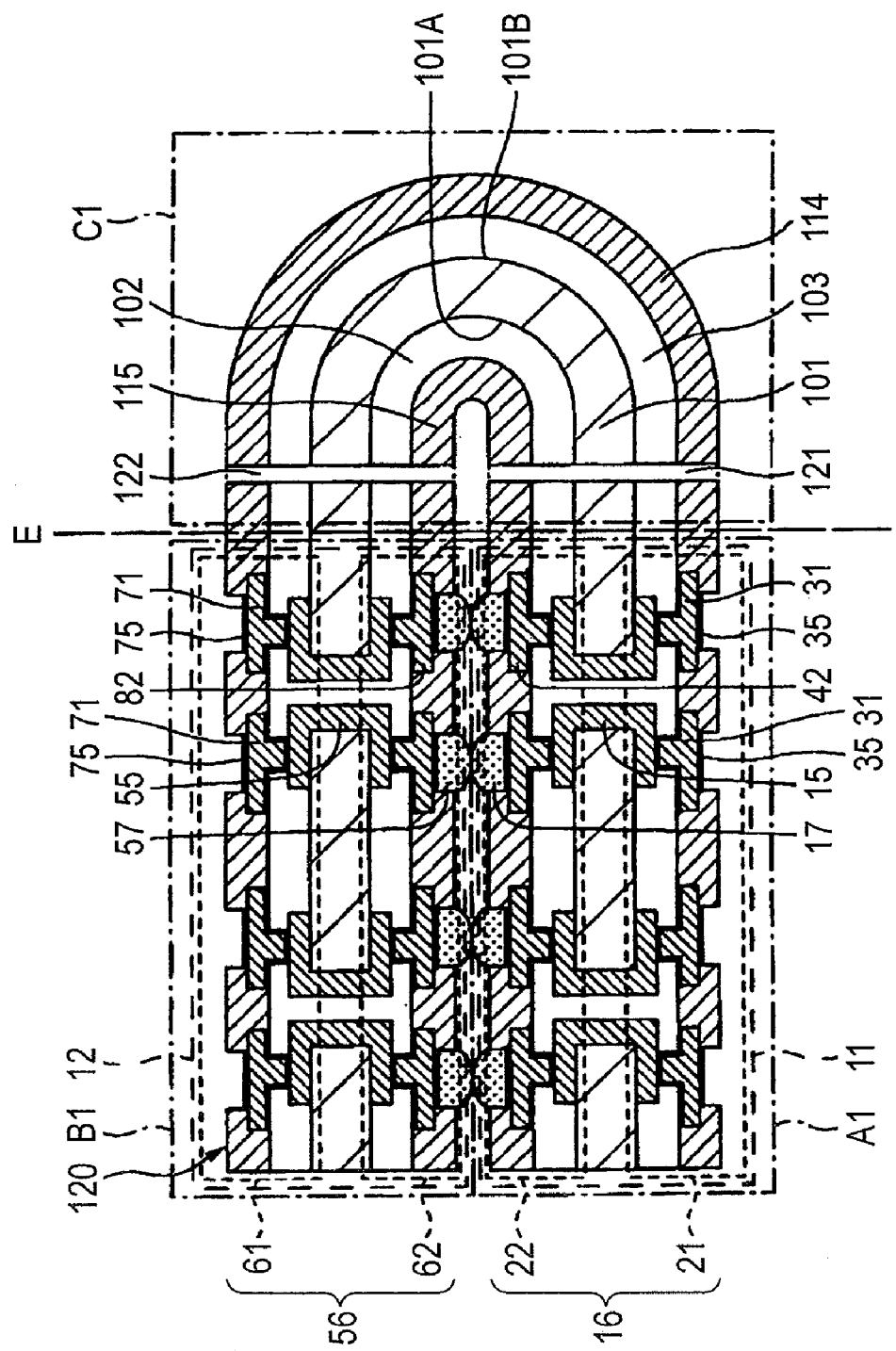
FIG. 18 is a diagram showing a manufacturing step of the multilayer wiring substrate according to the first exemplary embodiment of the invention (sixteenth).

By forming the first groove part 121 extending through the structural body 120 in the vicinity of the first region A1 of the structural body 120 corresponding to the third region C1 and the second groove part 122 extending through the structural body 120 in the vicinity of the second region B1 of the structural body 120 corresponding to the third region C1 thus, the portion of the structural body 120 corresponding to the third region C1 tends to be deformed, so that the portion of the structural body 120 corresponding to the third region C1 can be easily folded in a step shown in FIG. 18 described below.

Then, in the step shown in FIG. 18, the portion of the structural body 120 corresponding to the third region C1 is folded so as to oppose a second structural body 22 to a second structural body 62, and the melted internal connection terminals 17, 57 are contacted, and the internal connection terminal 17 is connected to the internal connection terminal 57 (a connection step). Consequently, the first multilayer wiring structural body 16 is electrically connected to the second multilayer wiring structural body 56 through the internal connection terminals 17, 57.

By folding the portion of the structural body 120 corresponding to the third region C1 so as to oppose the second structural body 22 to the second structural body 62 and connecting the internal connection terminal 17 to the internal connection terminal 57 thus, the first multilayer wiring structural body 16 can be electrically connected to the second multilayer wiring structural body 56 without dividing the first and second wiring substrates 11, 12 into individual pieces.

In addition, in FIG. 18, E shows a cut position (hereinafter called "a cut position E") in the case of cutting a structural body shown in FIG. 19. The cut position E is located at the boundary between the first and second regions A1, B1 and the third region C1.

Figure 19:
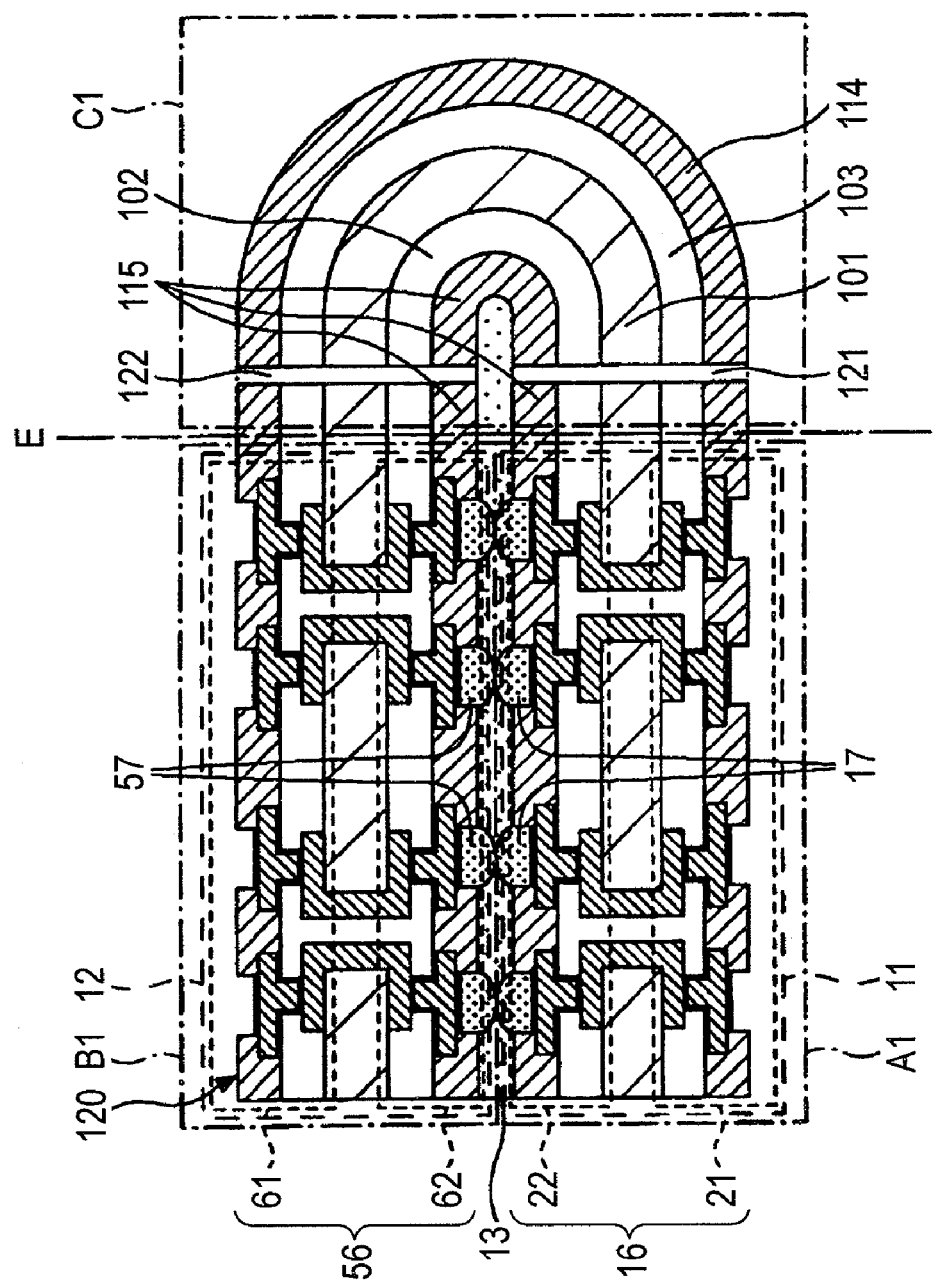
FIG. 19 is a diagram showing a manufacturing step of the multilayer wiring substrate according to the first exemplary embodiment of the invention (seventeenth).

Then, in a step shown in FIG. 19, a gap between the solder resist 115 corresponding to the first region A1 and the solder resist 115 corresponding to the second region B1 is filled with an underfill resin 13 in order to reinforce connection between the internal connection terminals 17, 57. As the underfill resin 13, for example, an epoxy resin or a polyimide resin can be used.

Figure 20:
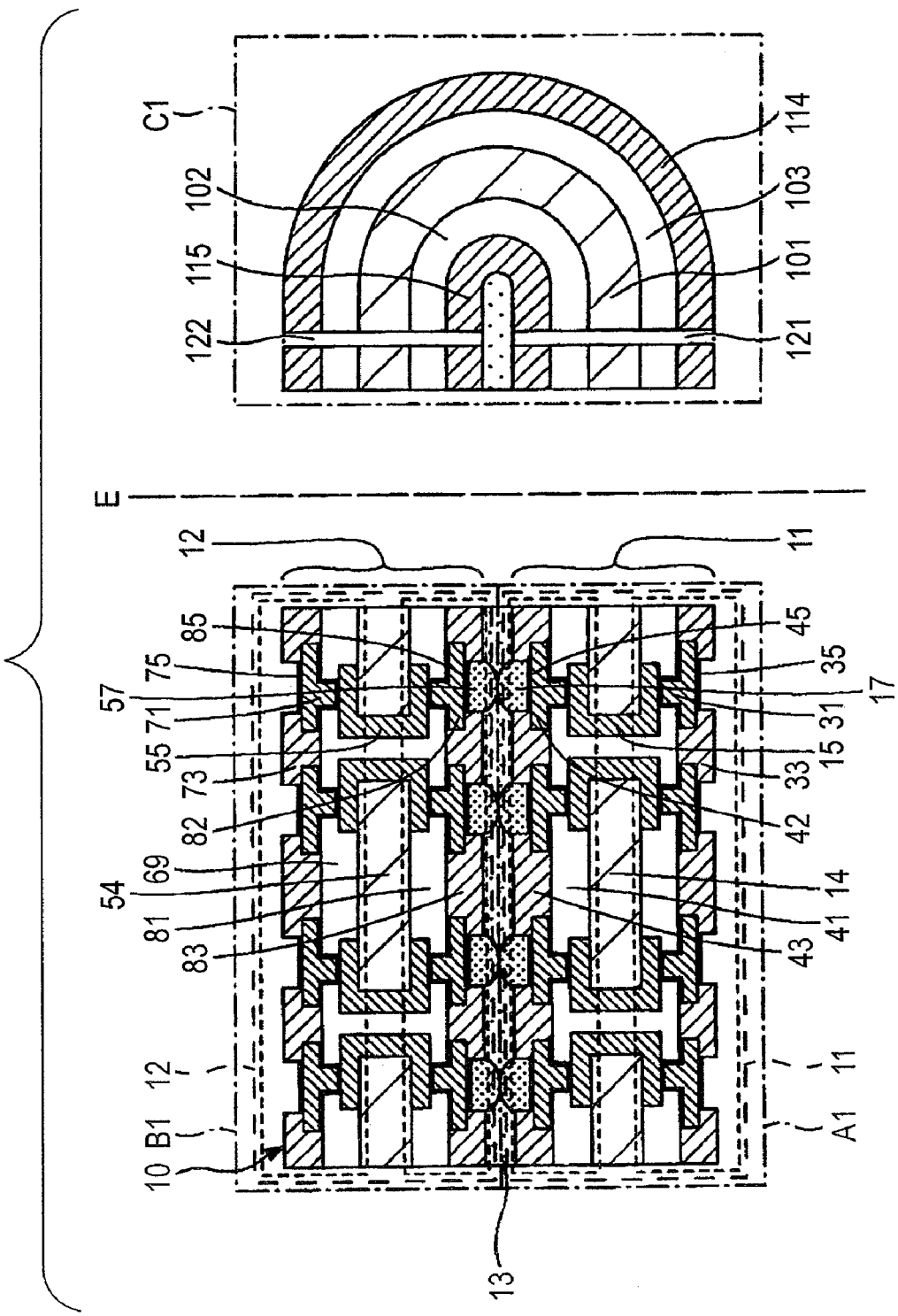
FIG. 20 is a diagram showing a manufacturing step of the multilayer wiring substrate according to the first exemplary embodiment of the invention (eighteenth).

Then, in a step shown in FIG. 20, a structural body 120 shown in FIG. 19 is cut along the cut position E (a substrate cut step). Consequently, the multilayer wiring substrate 10 comprising the first wiring substrate 11 having the first multilayer wiring structural body 16 and the second wiring substrate 12 having the second multilayer wiring structural body 56 is manufactured.

By cutting the structural body 120 shown in FIG. 19 after the first multilayer wiring structural body 16 is electrically connected to the second multilayer wiring structural body 56 thus, the multilayer wiring substrate 10 can be divided into individual pieces from the structural body 120 shown in FIG. 19 by one cut.

According to the manufacturing method of the multilayer wiring substrate of the embodiment, by simultaneously forming the first multilayer wiring structural body 16 and the second multilayer wiring structural body 56 on both surfaces 101A, 101B of one substrate 101 and thereafter folding the portion of the structural body 120 corresponding to the third region C1 so as to oppose the second structural body 22 to the second structural body 62 and electrically connecting the first multilayer wiring structural body 16 to the second multilayer wiring structural body 56, the number of laminations of the first and second multilayer wiring structural bodies 16, 56 (the number of laminations of wiring patterns and insulating layers) and the number of manufacturing steps of the first and second multilayer wiring structural bodies 16, 56 can be reduced, so that a yield of the multilayer wiring substrate 10 can be improved and also a manufacturing cost of the multilayer wiring substrate 10 can be reduced.

In addition, in the embodiment, the case of forming the solder as the internal connection terminals 17, 57 by the plating method has been described as an example, but the solder used as the internal connection terminals 17, 57 may be formed using a Super Jufit method (a registered trademark of Showa Denko K.K.). In this case, the need for the diffusion preventive films 45, 85 is eliminated.

Also, an Au bump instead of the solder may be used as the internal connection terminals 17, 57. In this case, the need for the step of forming the masking material 117 (step shown in FIG. 13) and the step of removing the masking material 117 (step shown in FIG. 15) is eliminated. When the Au bump is used as the internal connection terminals 17, 57, connection between the internal connection terminal 17 and the internal connection terminal 57 can be made by, for example, ultrasonic bonding.

Second Embodiment

Figure 23:
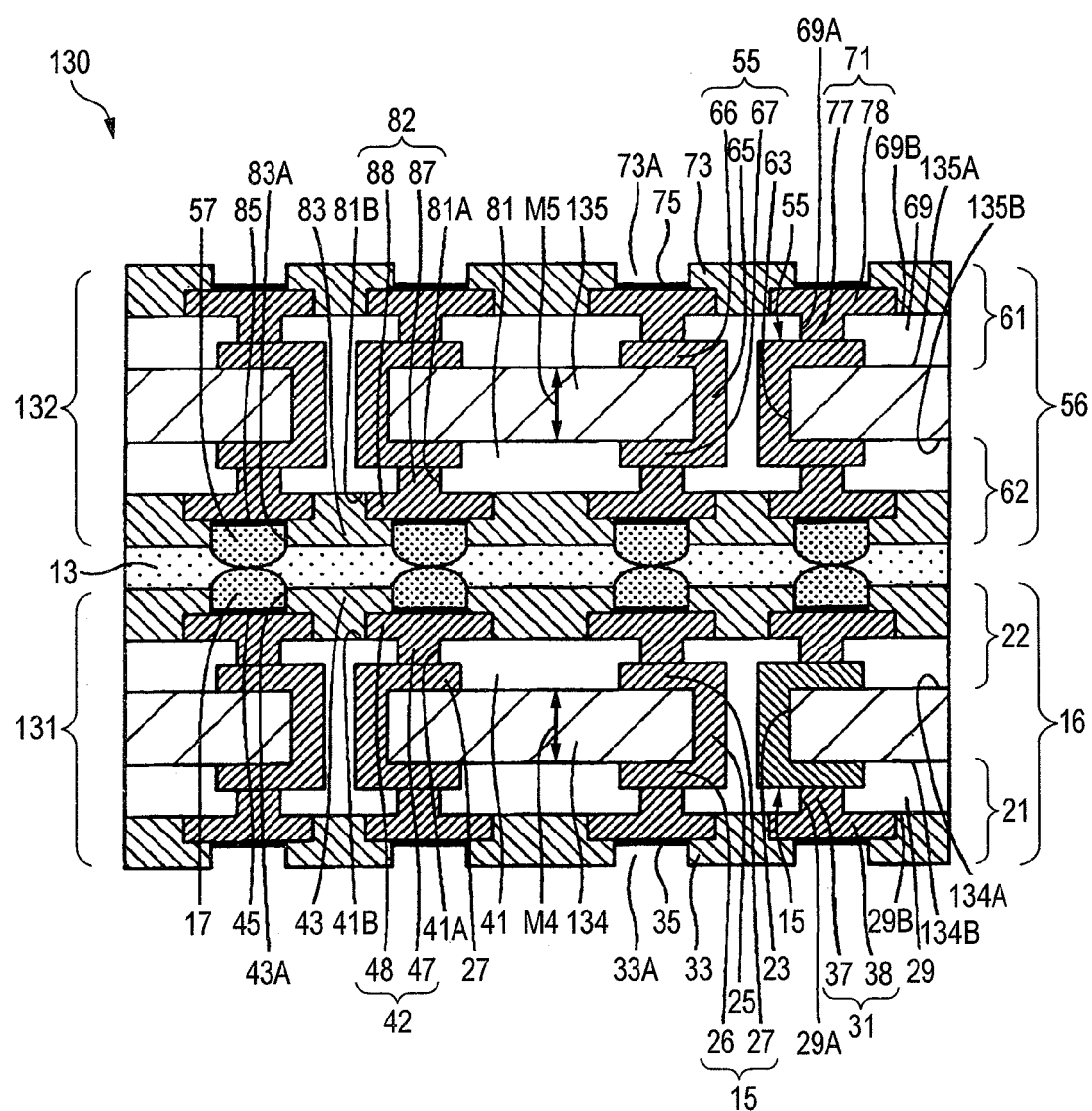
FIG. 23 is a sectional view of a multilayer wiring substrate according to a second exemplary embodiment of the invention.

FIG. 23 is a sectional view of a multilayer wiring substrate according to a second exemplary embodiment of the invention. In FIG. 23, the same numerals are assigned to the same component portions as those of the multilayer wiring substrate 10 of the first exemplary embodiment.

Referring to FIG. 23, a multilayer wiring substrate 130 of the second exemplary embodiment is constructed in a manner similar to the multilayer wiring substrate 10 except that first and second wiring substrates 131, 132 are disposed instead of the first and second wiring substrates 11, 12 disposed in the multilayer wiring substrate 10 of the first exemplary embodiment.

The first wiring substrate 131 is constructed in a manner similar to the first wiring substrate 11 except that a substrate 134 is disposed instead of the substrate 14 disposed in the first wiring substrate 11 described in the first exemplary embodiment.

The substrate 134 is formed in a plate shape, and has plural through holes 23. As the substrate 134, for example, a low elastic resin base material or a flexible resin base material can be used. The low elastic resin base material herein means a resin base material with its rigidity value of, for example, 30 MPa or more. As a material of the low elastic resin base material, for example, an epoxy resin can be used. As the flexible resin base material, a material with its rigidity value of, for example, 5 GPa or more can be used. A thickness M4 of the substrate 134 can be set at, for example, 0.2 mm.

The second wiring substrate 132 is constructed in a manner similar to the second wiring substrate 12 except that a substrate 135 is disposed instead of the substrate 54 disposed in the second wiring substrate 12 described in the first exemplary embodiment.

The substrate 135 is formed in a plate shape, and has plural through holes 63. As the substrate 135, for example, a low elastic resin base material or a flexible resin base material can be used. The low elastic resin base material herein means a resin base material with its rigidity value of, for example, 30 MPa or more. As a material of the low elastic resin base material, for example, an epoxy resin can be used. As the flexible resin base material, a material with its rigidity value of, for example, 5 GPa or more can be used. A thickness M5 of the substrate 135 could be constructed so as to become substantially equal to the thickness M4 of the substrate 134. The thickness M5 of the substrate 135 can be set at, for example, 0.2 mm.

FIGS. 24 to 34 are diagrams showing manufacturing steps of the multilayer wiring substrate according to the second exemplary embodiment of the invention. In FIGS. 24 to 34, the same numerals are assigned to the same component portions as those of the multilayer wiring substrate 130 of the second exemplary embodiment.

A manufacturing method of the multilayer wiring substrate 130 according to the second exemplary embodiment of the invention will be described with reference to FIGS. 24 to 34.

Figure 24:
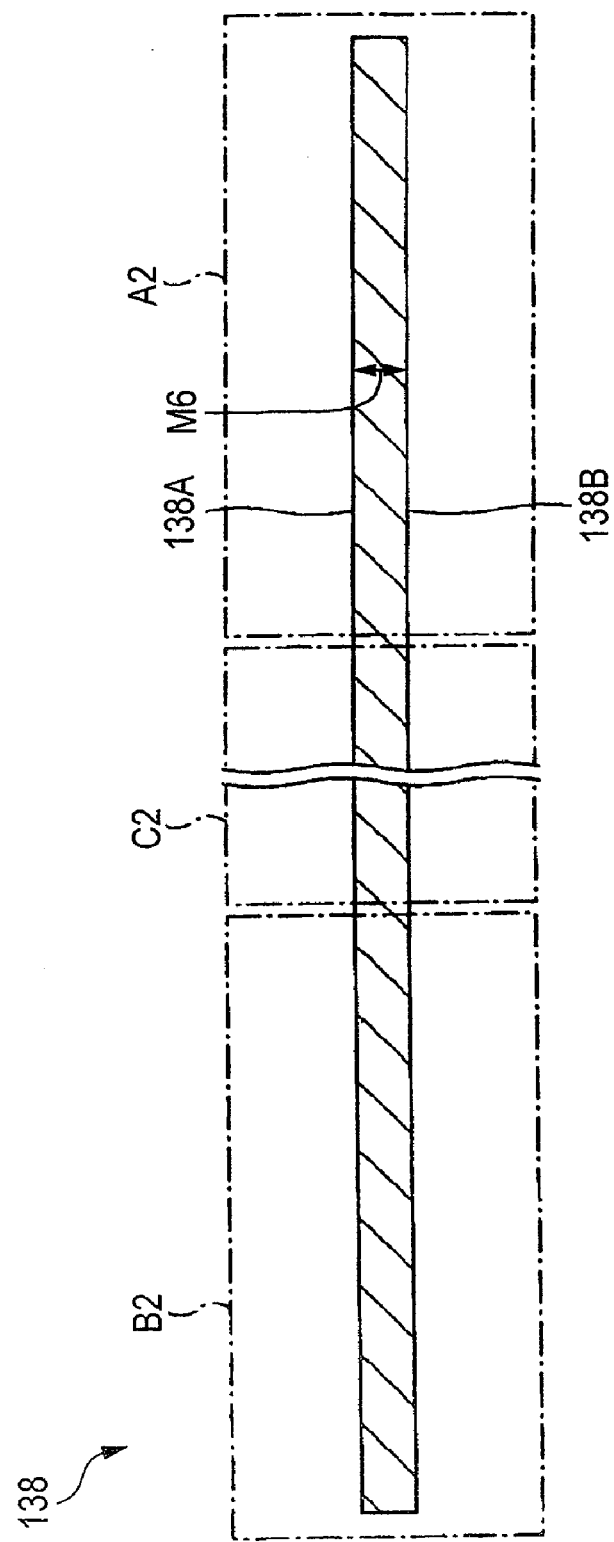
FIG. 24 is a diagram showing a manufacturing step of the multilayer wiring substrate according to the second exemplary embodiment of the invention (first).

First, in a step shown in FIG. 24, a substrate 138 having a first region A2 in which a first wiring substrate 131 comprising a first multilayer wiring structural body 16 is formed, a second region B2 in which a second wiring substrate 132 comprising a second multilayer wiring structural body 56 is formed, the second region B2 being disposed in a position spaced apart from the first region A2, and a third region C2 disposed between the first region A2 and the second region B2 is prepared (a substrate preparation step).

The substrate 138 corresponding to the first region A2 is the portion corresponding to a substrate 134 of the first wiring substrate 131, and the substrate 138 corresponding to the second region B2 is the portion corresponding to a substrate 135 of the second wiring substrate 132. An upper surface 138A of the substrate 138 corresponding to the first region A2 is a surface equivalent to a lower surface 134B of the substrate 134, and a lower surface 138B of the substrate 138 corresponding to the first region A2 is a surface equivalent to an upper surface 134A of the substrate 134. Also, the upper surface 138A of the substrate 101 corresponding to the second region B2 is a surface equivalent to an upper surface 135A of the substrate 135, and the lower surface 138B of the substrate 138 corresponding to the second region B2 is a surface equivalent to a lower surface 135B of the substrate 135.

The first multilayer wiring structural body 16 is formed on both surfaces 138A, 138B of the substrate 138 corresponding to the first region A2 as described below, and the second multilayer wiring structural body 56 is formed on both surfaces 138A, 138B of the substrate 138 corresponding to the second region B2 as described below.

By manufacturing the multilayer wiring substrate 130 using the substrate 138 having the first region A2 in which the first wiring substrate 131 comprising the first multilayer wiring structural body 16 is formed and the second region B2 in which the second wiring substrate 132 comprising the second multilayer wiring structural body 56 is formed thus, the number of laminations of the first and second multilayer wiring structural bodies 16, 56 formed on both surfaces 138A, 138B of the substrate 138 (the number of laminations of wiring patterns and insulating layers) can be reduced to suppress occurrence of poor electrical connection between wiring patterns 31, 42, 71, 82, so that a yield of the multilayer wiring substrate 130 can be improved.

As the substrate 138, for example, a low elastic resin base material or a flexible resin base material can be used. The low elastic resin base material herein means a resin base material with its rigidity value of, for example, 30 MPa or more. As a material of the low elastic resin base material, for example, an epoxy resin can be used. As the flexible resin base material, a material with its rigidity value of, for example, 5 GPa or more can be used. A thickness M6 of the substrate 138 can be set at, for example, 0.2 mm.

Figure 25:
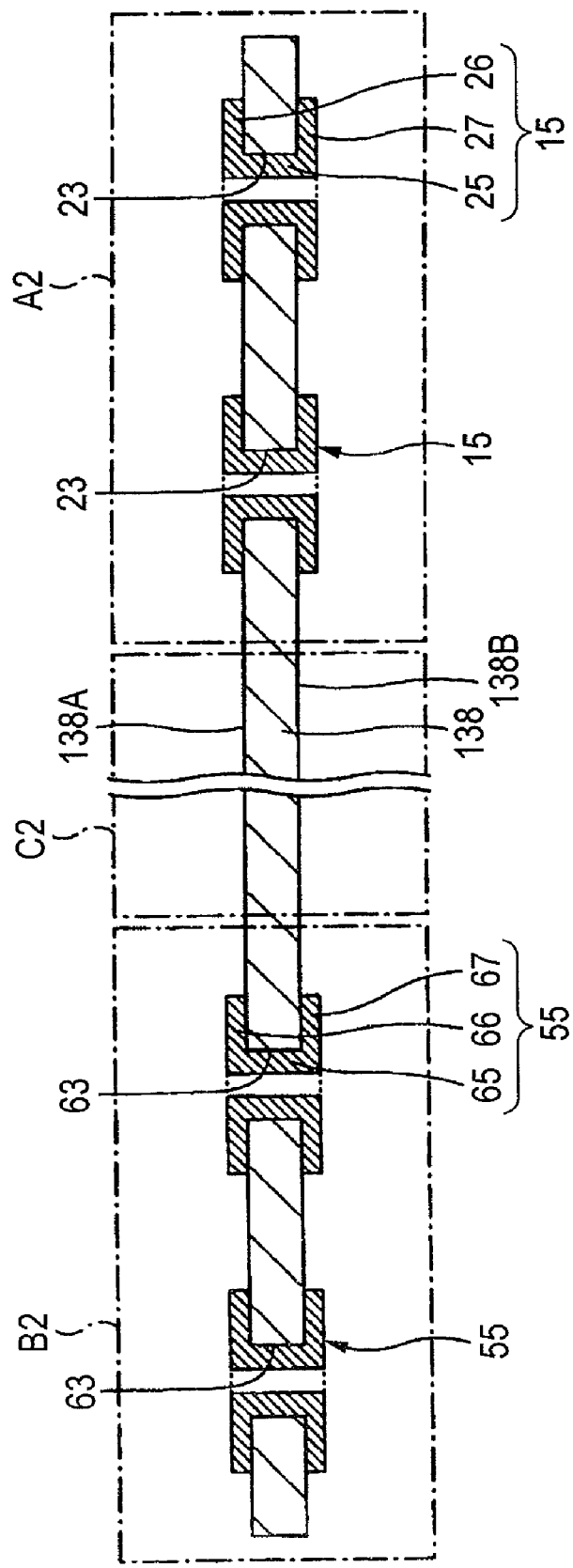
FIG. 25 is a diagram showing a manufacturing step of the multilayer wiring substrate according to the second exemplary embodiment of the invention (second).

Next, in a step shown in FIG. 25, through holes 23, 63 and through vias 15, 55 are sequentially formed by a technique similar to the steps shown in FIGS. 4 and 5 described in the first exemplary embodiment.

Figure 26:
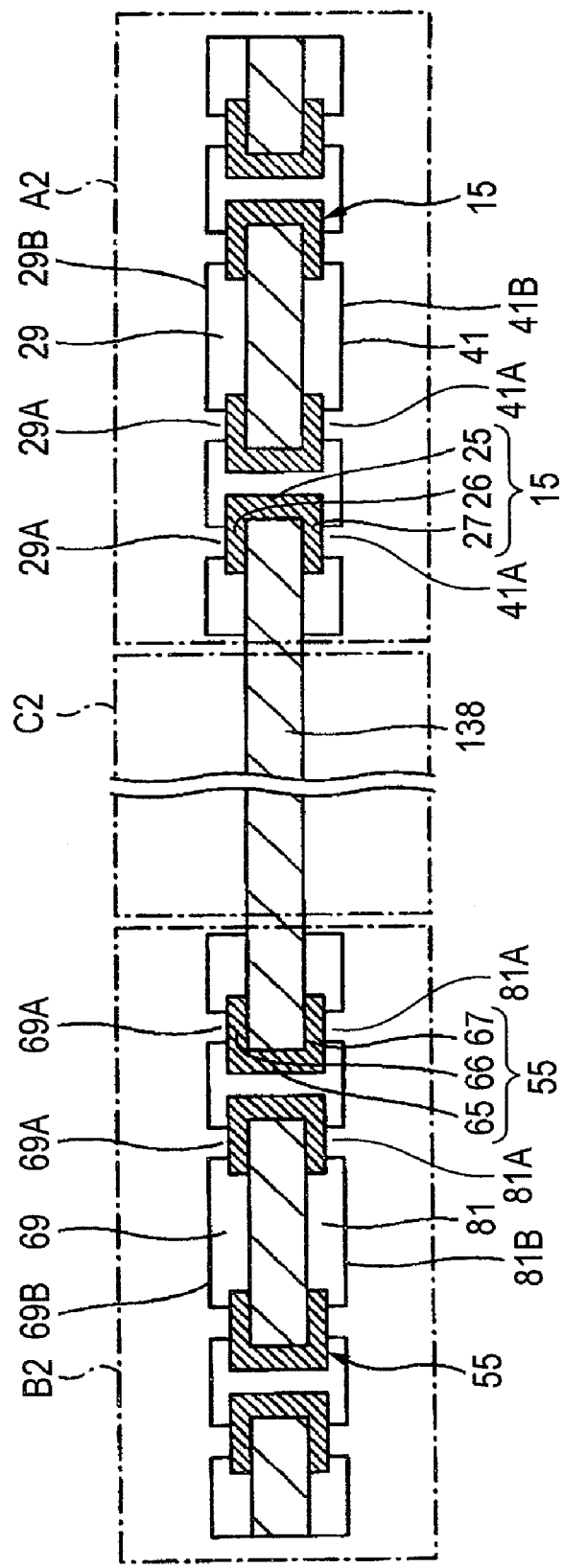
FIG. 26 is a diagram showing a manufacturing step of the multilayer wiring substrate according to the second exemplary embodiment of the invention (third).

Then, in a step shown in FIG. 26, insulating layers 29, 69 are formed on the upper surface side of a structural body shown in FIG. 25, and insulating layers 41, 81 are formed on the lower surface side of the structural body shown in FIG. 25. Thereafter, an opening 29A is formed in the insulating layer 29 and an opening 41A is formed in the insulating layer 41 and an opening 69A is formed in the insulating layer 69 and an opening 81A is formed in the insulating layer 81, respectively.

Concretely, for example, the insulating layers 29, 41, 69, 81 are formed by sticking a sheet-shaped resin material on both surfaces of the structural body shown in FIG. 25. Thereafter, the openings 29A, 41A, 69A, 81A are formed in the insulating layers 29, 41, 69, 81 using, for example, laser machining.

Figure 27:
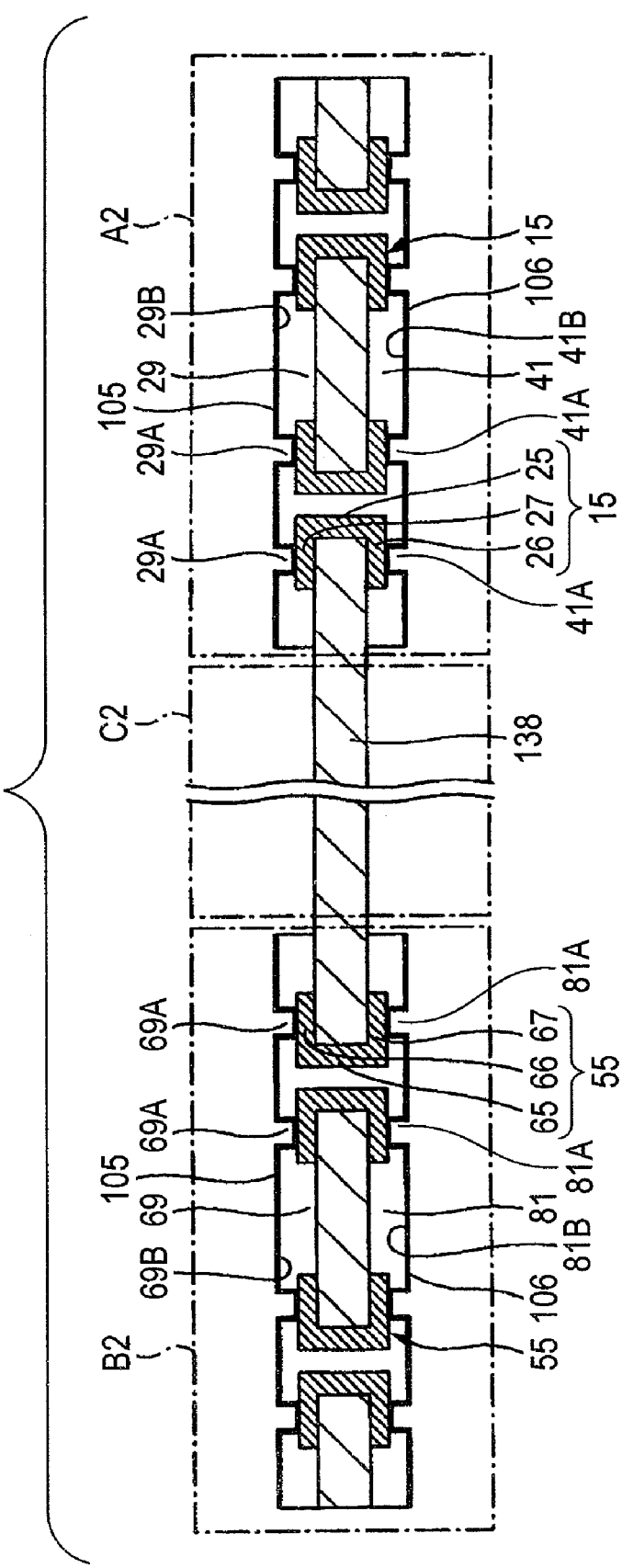
FIG. 27 is a diagram showing a manufacturing step of the multilayer wiring substrate according to the second exemplary embodiment of the invention (fourth).

Then, in a step shown in FIG. 27, a seed layer 105 with which the openings 29A, 69A, a surface 29B of the insulating layer 29 and a surface 69B of the insulating layer 69 are covered and a seed layer 106 with which the openings 41A, 81A, a surface 41B of the insulating layer 41 and a surface 81B of the insulating layer 81 are covered are simultaneously formed by a technique similar to the step shown in FIG. 7 described in the first exemplary embodiment.

Figure 28:
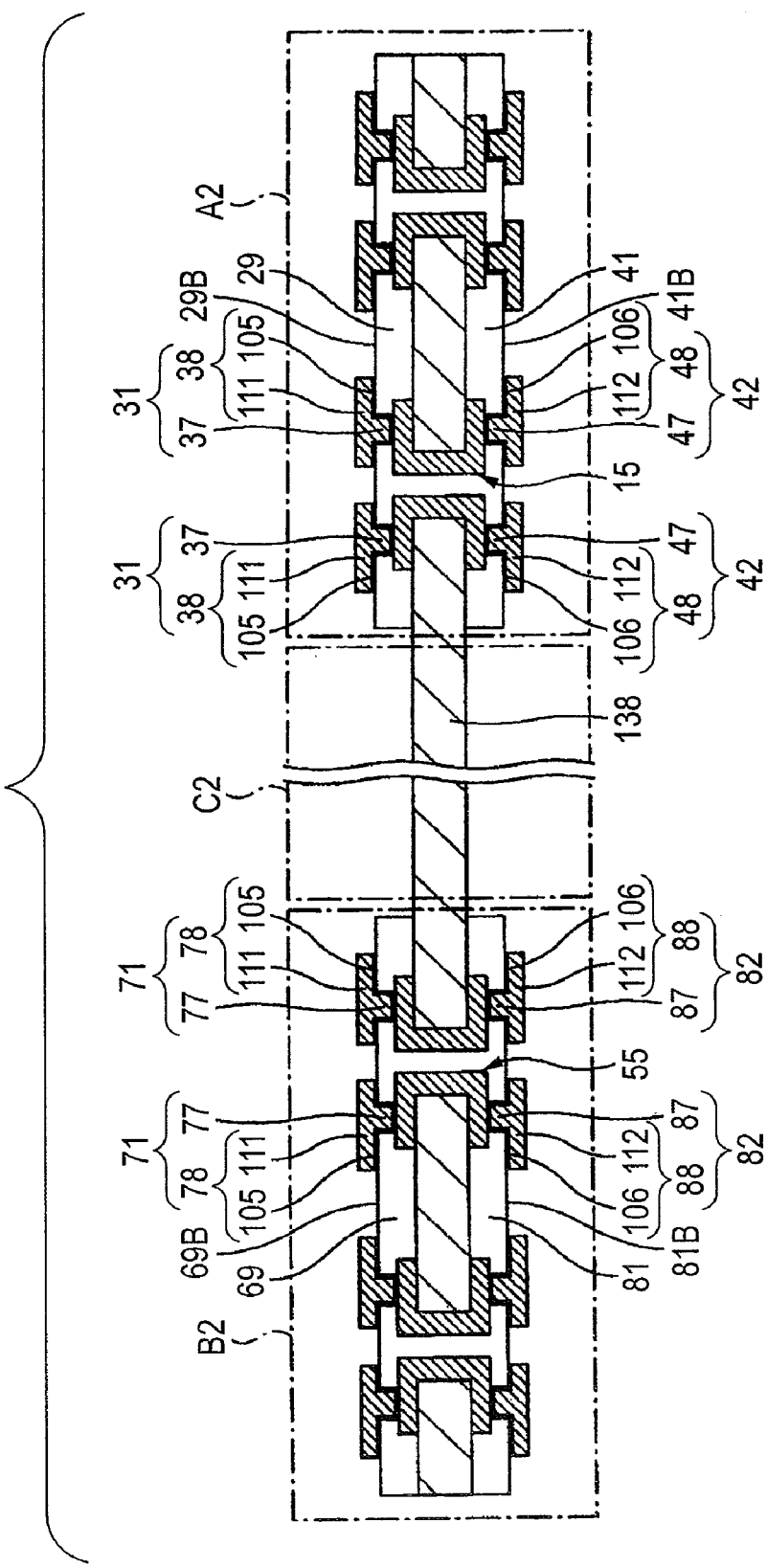
FIG. 28 is a diagram showing a manufacturing step of the multilayer wiring substrate according to the second exemplary embodiment of the invention (fifth).

Then, in a step shown in FIG. 28, wiring patterns 31, 42, 71, 82 are formed by a technique similar to the steps shown in FIGS. 8 to 10 described in the first exemplary embodiment.

Figure 11:
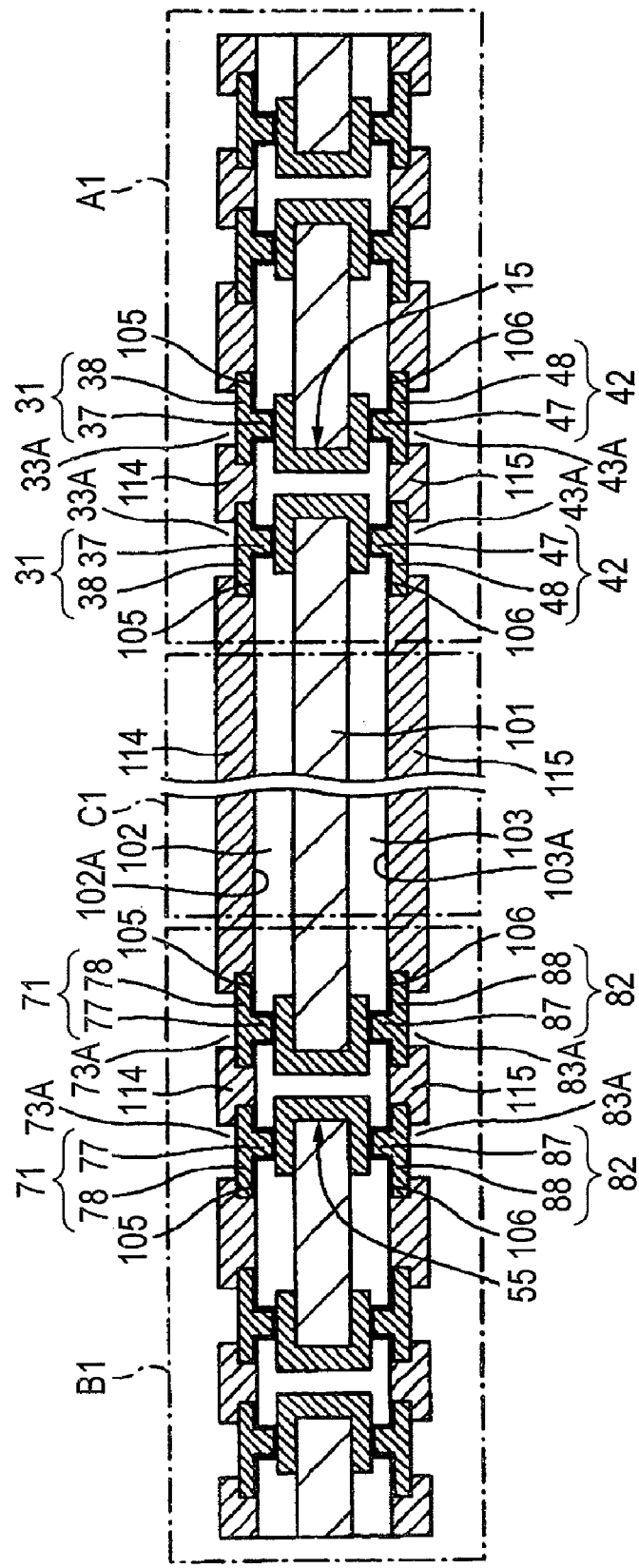
FIG. 11 is a diagram showing a manufacturing step of the multilayer wiring substrate according to the first exemplary embodiment of the invention (ninth).
Figure 29:
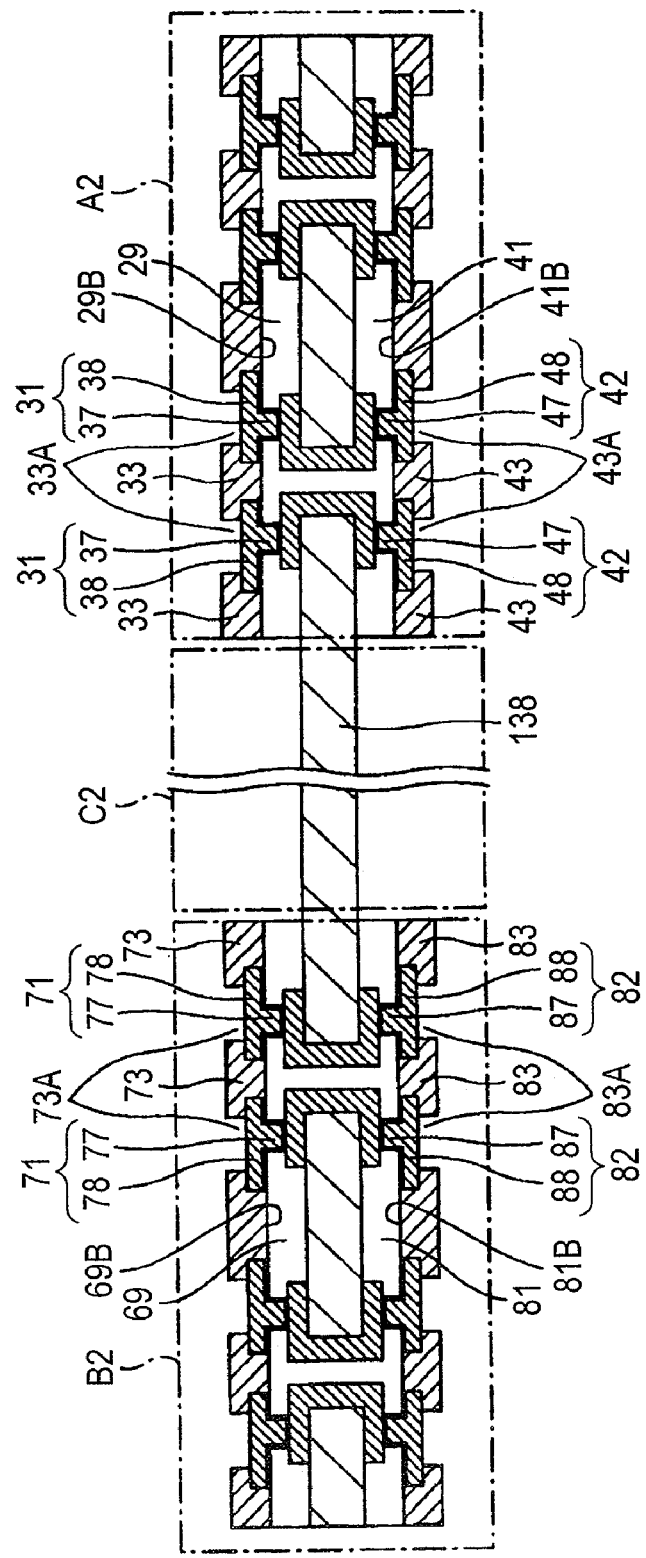
FIG. 29 is a diagram showing a manufacturing step of the multilayer wiring substrate according to the second exemplary embodiment of the invention (sixth).

Then, in a step shown in FIG. 29, a solder resist 33 with which wiring 38 and the surface 29B of the insulating layer 29 are covered, a solder resist 43 with which wiring 48 and the surface 41B of the insulating layer 41 are covered, a solder resist 73 with which wiring 78 and the surface 69B of the insulating layer 69 are covered and a solder resist 83 with which wiring 88 and the surface 81B of the insulating layer 81 are covered are formed by a technique similar to the step shown in FIG. 11 described in the first exemplary embodiment. Thereafter, openings 33A, 43A, 73A, 83A are formed in the solder resists 33, 43, 73, 83.

Figure 30:
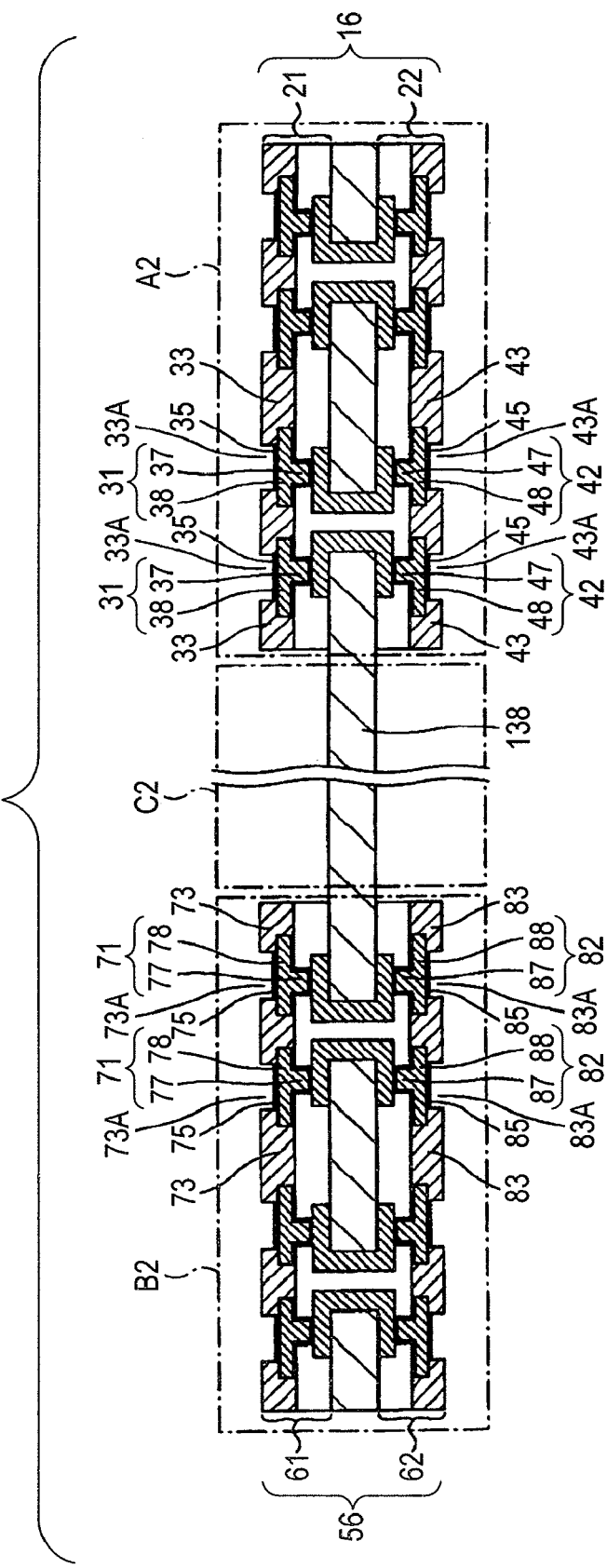
FIG. 30 is a diagram showing a manufacturing step of the multilayer wiring substrate according to the second exemplary embodiment of the invention (seventh).

Then, in a step shown in FIG. 30, diffusion preventive films 35, 45, 75, 85 are formed by a technique similar to the step shown in FIG. 12 described in the first exemplary embodiment. Consequently, the first multilayer wiring structural body 16 and the second multilayer wiring structural body 56 are simultaneously formed.

By simultaneously forming the first multilayer wiring structural body 16 and the second multilayer wiring structural body 56 on both surfaces 138A, 138B of one substrate 138 thus, the number of manufacturing steps of the first and second multilayer wiring structural bodies 16, 56 becomes smaller than the related-art manufacturing method of the multilayer wiring substrate in which multilayer wiring structural bodies are respectively formed on both surfaces of two substrates, so that a yield of the multilayer wiring substrate 130 can be improved and also a manufacturing cost of the multilayer wiring substrate 130 can be reduced.

Figure 31:
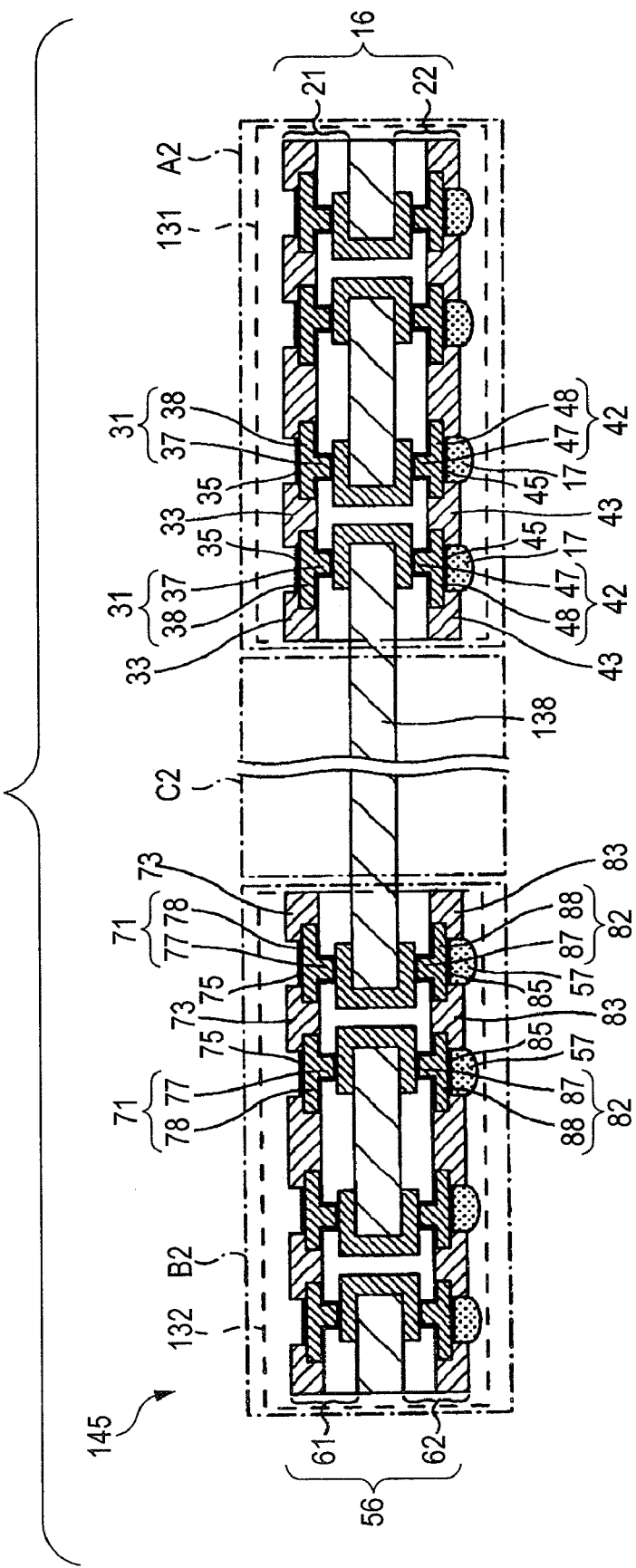
FIG. 31 is a diagram showing a manufacturing step of the multilayer wiring substrate according to the second exemplary embodiment of the invention (eighth).

Then, in a step shown in FIG. 31, an internal connection terminal 17 is formed on the diffusion preventive film 43 and an internal connection terminal 57 is formed on the diffusion preventive film 85 by a technique similar to the steps shown in FIGS. 13 to 16 described in the first exemplary embodiment.

Consequently, the first wiring substrate 131 is formed in the portion corresponding to the first region A2 of a structural body 145 shown in FIG. 31, and the second wiring substrate 132 is formed in the portion corresponding to the second region B2 of the structural body 145. In addition, in the case of FIG. 31, solder bumps are formed as the internal connection terminals 17, 57.

Figure 32:
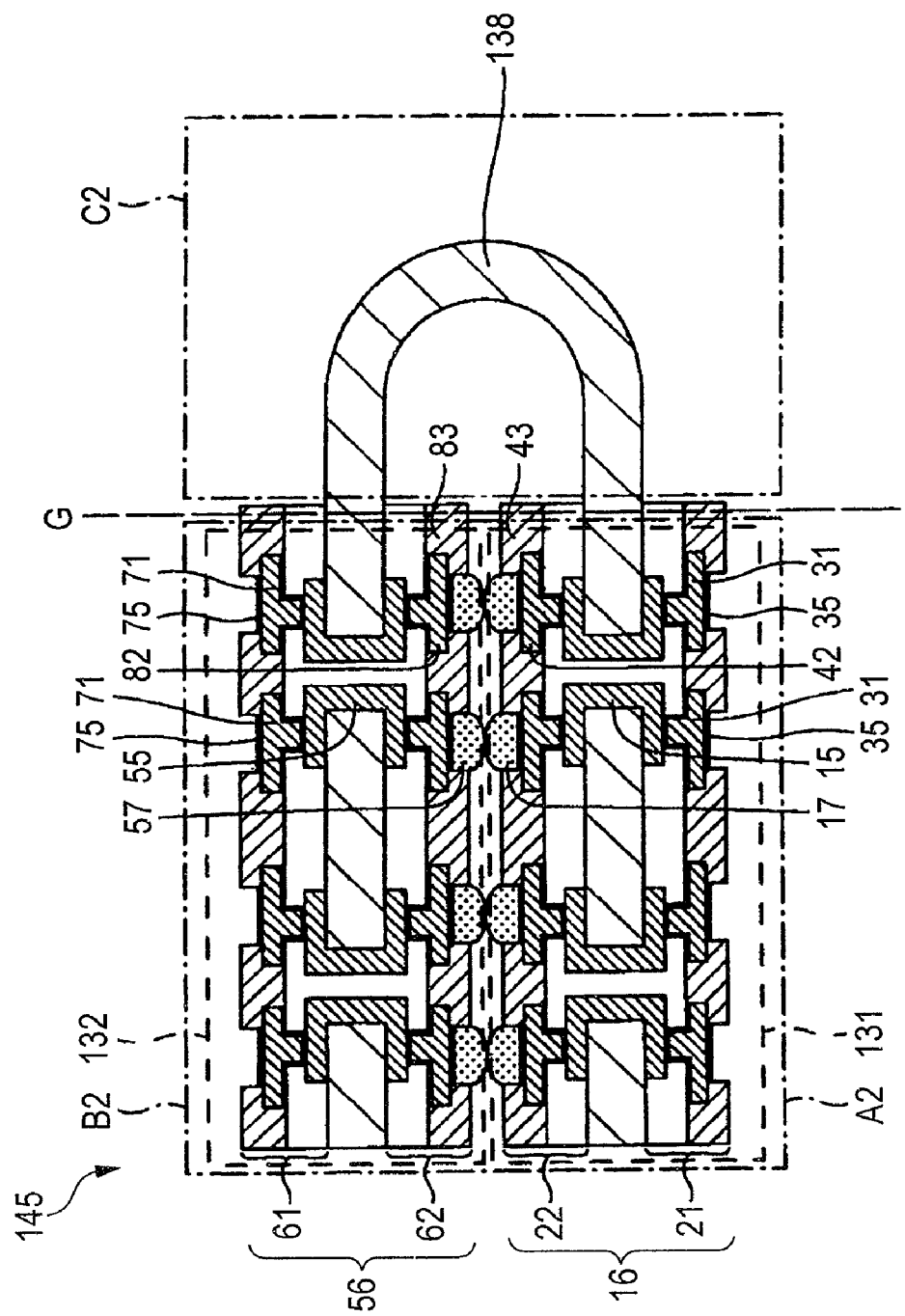
FIG. 32 is a diagram showing a manufacturing step of the multilayer wiring substrate according to the second exemplary embodiment of the invention (ninth).

Then, in the step shown in FIG. 32, the portion of the structural body 145 corresponding to the third region C2 is folded so as to oppose a second structural body 22 to a second structural body 62, and the melted internal connection terminals 17, 57 are contacted, and the internal connection terminal 17 is connected to the internal connection terminal 57 (a connection step).

Consequently, the first multilayer wiring structural body 16 disposed in the first wiring substrate 131 is electrically connected to the second multilayer wiring structural body 56 disposed in the second wiring substrate 132 through the internal connection terminals 17, 57.

By folding the portion of the structural body 145 corresponding to the third region C2 so as to oppose the second structural body 22 to the second structural body 62 and connecting the internal connection terminal 17 to the internal connection terminal 57 thus, the first multilayer wiring structural body 16 can be electrically connected to the second multilayer wiring structural body 56 without dividing the first and second wiring substrates 131, 132 into individual pieces.

In addition, in FIG. 32, G shows a cut position (hereinafter called "a cut position G") in the case of cutting a structural body shown in FIG. 33. The cut position G is located at the boundary between the first and second regions A2, B2 and the third region C2.

Figure 33:
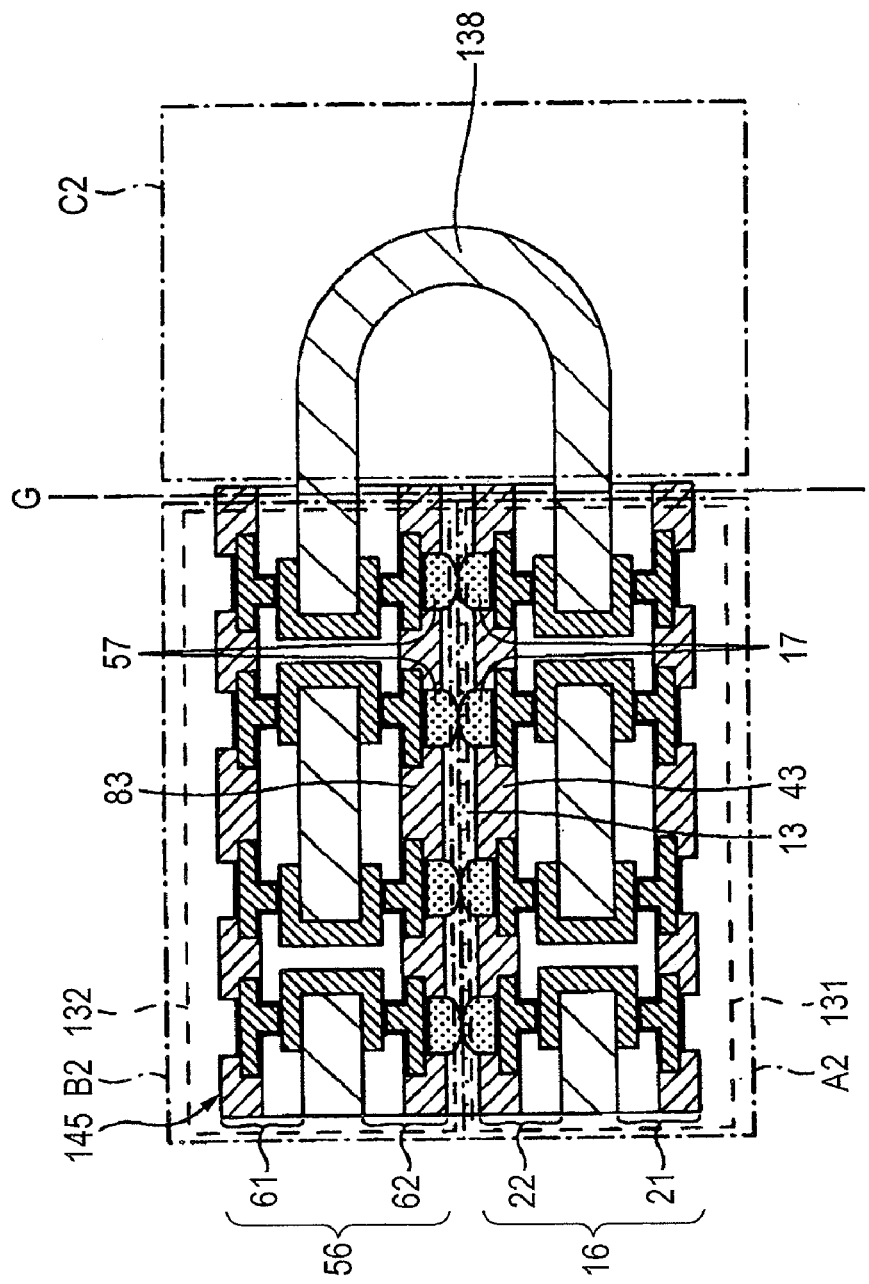
FIG. 33 is a diagram showing a manufacturing step of the multilayer wiring substrate according to the second exemplary embodiment of the invention (tenth).

Then, in a step shown in FIG. 33, a gap between the solder resist 43 and the solder resist 83 is filled with an underfill resin 13 in order to reinforce connection between the internal connection terminals 17, 57.

Figure 34:
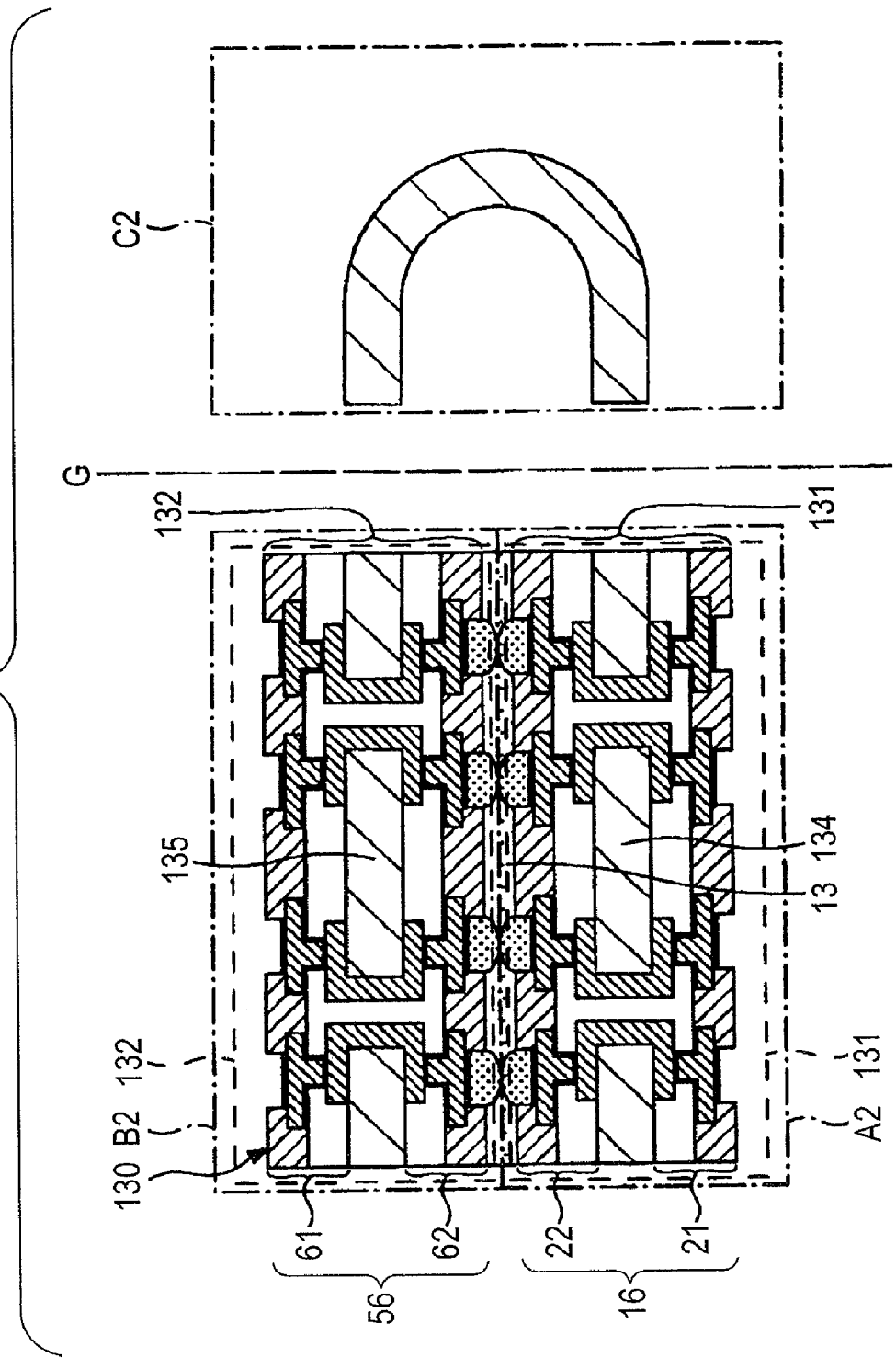
FIG. 34 is a diagram showing a manufacturing step of the multilayer wiring substrate according to the second exemplary embodiment of the invention (eleventh).

Then, in a step shown in FIG. 34, the structural body 145 shown in FIG. 33 is cut along the cut position G (a substrate cut step). Consequently, the multilayer wiring substrate 130 comprising the first wiring substrate 131 having the first multilayer wiring structural body 16 and the second wiring substrate 132 having the second multilayer wiring structural body 56 is manufactured.

By cutting the structural body 145 shown in FIG. 33 after the first multilayer wiring structural body 16 is electrically connected to the second multilayer wiring structural body 56 thus, the multilayer wiring substrate 130 can be divided into individual pieces from the structural body 145 shown in FIG. 33 by one cut.

According to the manufacturing method of the multilayer wiring substrate of the embodiment, by simultaneously forming the first multilayer wiring structural body 16 and the second multilayer wiring structural body 56 on both surfaces 138A, 138B of one substrate 138 and thereafter folding the portion of the structural body 145 corresponding to the third region C2 so as to oppose the second structural body 22 to the second structural body 62 and electrically connecting the first multilayer wiring structural body 16 to the second multilayer wiring structural body 56 the number of laminations of the first and second multilayer wiring structural bodies 16, 56 (the number of laminations of wiring patterns and insulating layers) and the number of manufacturing steps of the first and second multilayer wiring structural bodies 16, 56 can be reduced, so that a yield of the multilayer wiring substrate 130 can be improved and also a manufacturing cost of the multilayer wiring substrate 130 can be reduced.

In addition, in the embodiment, the case of forming the solder as the internal connection terminals 17, 57 by the plating method has been described as an example, but the solder used as the internal connection terminals 17, 57 may be formed using a Super Jufit method (a registered trademark of Showa Denko K.K.). In this case, the need for the diffusion preventive films 45, 85 is eliminated.

Also, an Au bump instead of the solder may be used as the internal connection terminals 17, 57. In this case, the need for the step of forming the masking material and the step of removing the masking material is eliminated. When the Au bump is used as the internal connection terminals 17, 57, connection between the internal connection terminal 17 and the internal connection terminal 57 can be made by, for example, ultrasonic bonding.

The preferred embodiments of the invention have been described above in detail, but the invention is not limited to such specific embodiments, and various modifications and changes can be made within the gist of the invention described in the claims.

The invention can be applied to a manufacturing method of a multilayer wiring substrate having a multilayer wiring structural body.

What is claimed is:

1. A manufacturing method of a wiring substrate, comprising:
 a substrate preparation step of preparing a substrate having a first region in which a first multilayer wiring structural body comprising plural insulating layers and wiring patterns is formed, and a second region in which a second multilayer wiring structural body comprising plural insulating layers and wiring patterns is formed, the second region being disposed in a position spaced apart from said first region;

a first and second multilayer wiring structural body formation step of simultaneously forming the first multilayer wiring structural body and the second multilayer wiring structural body on both surfaces of the substrate;

a connection step of folding the substrate so as to oppose the first multilayer wiring structural body to the second multilayer wiring structural body and electrically connecting the first multilayer wiring structural body to the second multilayer wiring structural body; and a substrate cut step of cutting the substrate so that the substrate corresponding to the first and second regions is separated from the substrate of the folded portion.

2. A manufacturing method of a wiring substrate as claimed in claim 1, further comprising:

a groove part formation step of forming a groove part in the substrate located between the substrate corresponding to the first region and the substrate corresponding to the second region.

3. A manufacturing method of a wiring substrate as claimed in claim 2, wherein the groove part is formed so as to extend through the substrate.

4. A manufacturing method of a wiring substrate as claimed in claim 1, further comprising:

a groove part formation step of forming a groove part in the substrate located between the substrate corresponding to the first region and the substrate corresponding to the second region before the substrate cut step.

5. A manufacturing method of a wiring substrate as claimed in claim 4, wherein the groove part is formed so as to extend through the substrate.

6. A manufacturing method of a wiring substrate as claimed in claim 4, wherein the groove part has a first groove part and a second groove part, and the first groove part is formed in the vicinity of the first region, and the second groove part is formed in the vicinity of the second region.

7. A manufacturing method of a wiring substrate, comprising:

a substrate preparation step of preparing a substrate having a first region in which a first multilayer wiring structural body comprising plural insulating layers and wiring patterns is formed, and a second region in which a second multilayer wiring structural body comprising plural insulating layers and wiring patterns is formed, the second region being disposed in a position spaced apart from said first region;

a first and second multilayer wiring structural body formation step of simultaneously forming the first multilayer wiring structural body and the second multilayer wiring structural body on both surfaces of the substrate;

a connection step of folding the substrate so as to oppose the first multilayer wiring structural body to the second multilayer wiring structural body and electrically connecting the first multilayer wiring structural body to the second multilayer wiring structural body; and a groove part formation step of forming a groove part in the substrate located between the substrate corresponding to the first region and the substrate corresponding to the second region, wherein the groove part has a first groove part and a second groove part, and the first groove part is formed in the vicinity of the first region, and the second groove part is formed in the vicinity of the second region.

\* \* \* \* \*